United States Patent
Yamaguchi et al.

(10) Patent No.: US 7,872,411 B2
(45) Date of Patent: Jan. 18, 2011

(54) ORGANIC ELECTROLUMINESCENCE DEVICE USING A COPOLYMER AND A PHOSPHORESCENT COMPOUND

(75) Inventors: Tetsuhiko Yamaguchi, Chiba (JP); Yoshiaki Takahashi, Chiba (JP); Tamami Koyama, Chiba (JP)

(73) Assignee: Showa Denko K.K., Tokyo (JP)

( * ) Notice: Subject to any disclaimer, the term of this patent is extended or adjusted under 35 U.S.C. 154(b) by 410 days.

(21) Appl. No.: 12/063,698

(22) PCT Filed: Aug. 4, 2006

(86) PCT No.: PCT/JP2006/315892

§ 371 (c)(1),
(2), (4) Date: Feb. 13, 2008

(87) PCT Pub. No.: WO2007/020881

PCT Pub. Date: Feb. 22, 2007

(65) Prior Publication Data

US 2009/0284133 A1    Nov. 19, 2009

Related U.S. Application Data

(60) Provisional application No. 60/711,675, filed on Aug. 29, 2005.

(30) Foreign Application Priority Data

Aug. 17, 2005    (JP) ............................. 2005-236511

(51) Int. Cl.
*H01L 51/50* (2006.01)
(52) U.S. Cl. ...................... 313/504; 526/310
(58) Field of Classification Search ................. 313/504; 428/690; 526/310
See application file for complete search history.

(56) References Cited

U.S. PATENT DOCUMENTS

2004/0258953 A1    12/2004    Kido et al.

(Continued)

FOREIGN PATENT DOCUMENTS

JP    2002363227    12/2002

(Continued)

OTHER PUBLICATIONS

Mitsunori Suzuki et al., "Highly efficient polymer light-emitting devices using ambipolar phosophorescent polymers", Applied Physics Letters, AIP, American Institute of Physics, Mar. 3, 2005, pp. 103507(1-3), vol. 86, No. 10.

*Primary Examiner*—Nimeshkumar D Patel
*Assistant Examiner*—Mary Ellen Bowman
(74) *Attorney, Agent, or Firm*—Sughrue Mion, PLLC

(57) ABSTRACT

An organic electroluminescence device including one layer or two or more layers of organic layer sandwiched between an anode and a cathode. At least one of the organic layers includes a phosphorescent compound and a polymer. The polymer has a structural unit derived from a monomer represented by formula (1) as defined herein, and a structural unit derived from a monomer having heterocycle(s) containing two or more heteroatoms.

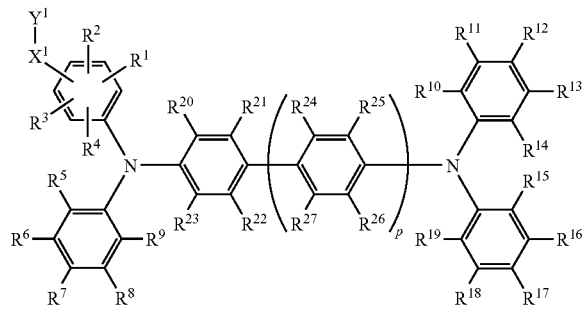

3 Claims, 1 Drawing Sheet

U.S. PATENT DOCUMENTS

2007/0155928 A1 * 7/2007 Koyama et al. ............. 526/310

FOREIGN PATENT DOCUMENTS

| JP | 200597589 | 4/2005 |
|---|---|---|
| WO | 2004093154 A2 | 10/2004 |
| WO | 2005021678 A2 | 3/2005 |
| WO | 2005061562 A1 | 7/2005 |
| WO | 2006001150 A1 | 1/2006 |

* cited by examiner

ORGANIC ELECTROLUMINESCENCE DEVICE USING A COPOLYMER AND A PHOSPHORESCENT COMPOUND

CROSS-REFERENCE TO RELATED APPLICATIONS

This application claims the benefit under 35 U.S.C. .sctn. 119(e) of U.S. Provisional Application No. 60/711,675 filed on Aug. 29, 2005.

TECHNICAL FIELD

The present invention relates to an organic electroluminescence device using a phosphorescent compound. More specifically the present invention relates to an organic electroluminescence device comprising an organic layer containing a phosphorescent compound and a polymer, capable of simplifying the production process, realizing enlargement of the area, and also attaining high luminous efficiency and high durability.

BACKGROUND ART

Recently for widening use of an organic electroluminescence device (in the present specification also referred to as organic EL device), materials using phosphorescent compounds with high luminous efficiency have been eagerly developed.

In general, an organic EL device comprises one layer or two or more layers of organic layer sandwiched between an anode and a cathode. Using a polymer as a material for forming these layers, a film can be easily formed by coating a solution wherein this polymer is dissolved, and enlargement of the area and production on a larger scale of the device become possible.

For example, Patent document 1 discloses an organic EL device having a layer comprising a polymer with structural units derived from a hole-transporting carbazole derivative and an electron-transporting oxadiazole derivative, and a phosphorescent compound.

In the case wherein the polymer contains structural units derived from the carbazole derivative, however, there have been problems that high luminous efficiency cannot be attained and that the durability of the element is low.

To overcome these problems, Patent document 2 tried using a triphenylamine derivative instead of the carbazole derivative as a hole transport compound. Specifically this literature discloses a polymer having structural units derived from a triphenylamine derivative, an oxadiazole derivative and a phosphorescent compound.

However, in some combinations of monomers employed, distribution of the structural unit derived from each compound became heterogeneous in the polymer due to difference in polymerizability of each compound. With an organic EL device using a polymer with such heterogeneous distribution, there have been problems that the luminous efficiency is not high and that the durability of the element is also low.

For these reasons, it has been desired to develop materials that are suitable for enlargement of the area and scale-up of production and also provides high luminous efficiency and high durability.

[Patent document 1] JP-A-2002-363227
[Patent document 2] JP-A-2005-97589

DISCLOSURE OF THE INVENTION

An object of the present invention is to provide an organic EL device with which the production process is simplified, enlargement of the area is realized, and high luminous efficiency and high durability are attained.

The present inventors have diligently studied to solve the above-mentioned problems, as a result, they have found that the above-mentioned problems can be conquered by using a polymer containing a structural unit derived from a specific triphenylamine derivative and a structural unit derived from a specific derivative of a heterocyclic compound. Based on the finding, the present invention has been accomplished.

Namely, the present invention is summarized as follows:

[1] An organic electroluminescence device comprising one layer or two or more layers of organic layer sandwiched between an anode and a cathode wherein:

at least one of the organic layers comprises a phosphorescent compound and a polymer;

the polymer comprises a structural unit derived from a monomer represented by the following formula (1) and a structural unit derived from a monomer having heterocycle(s) containing two or more heteroatoms.

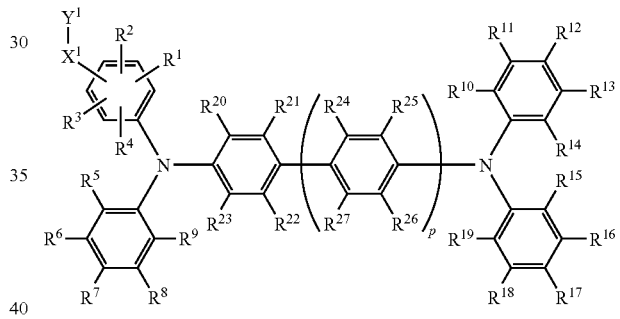

(1)

(In the formula, $R^1$-$R^{27}$ each represents independently a hydrogen atom, a halogen atom, a cyano group, an amino group, an alkyl group having 1 to 10 carbon atoms or an alkoxy group having 1 to 10 carbon atoms; within each of the groups $R^1$-$R^4$, $R^5$-$R^9$, $R^{10}$-$R^{14}$ and $R^{15}$-$R^{19}$, two groups bonding to adjacent carbon atoms in a benzene ring may bond to each other forming a fused ring; $X^1$ represents a single bond, an oxygen atom (—O—), a sulfur atom (—S—), —SO—, —SO$_2$—, —NR— (R represents a hydrogen atom, an alkyl group having 1 to 4 carbon atoms or a phenyl group), —CO— or a divalent organic group having 1 to 20 carbon atoms (the organic group may be substituted with an atom or a group selected from the group consisting of an oxygen atom (—O—), a sulfur atom (—S—), —SO—, —SO$_2$—, —NR— (R represents a hydrogen atom, an alkyl group having 1 to 4 carbon atoms or a phenyl group) and —CO—); $Y^1$ represents a polymerizable functional group; and p represents 0 or 1.)

[2] The organic electroluminescence device as described in [1], wherein the monomer having heterocycle(s) is an oxadiazole derivative or a triazole derivative.

[3] The organic electroluminescence device as described in [2], wherein the monomer having heterocycle (s) is selected from the group consisting of monomers represented by the following formulae (2) to (5).

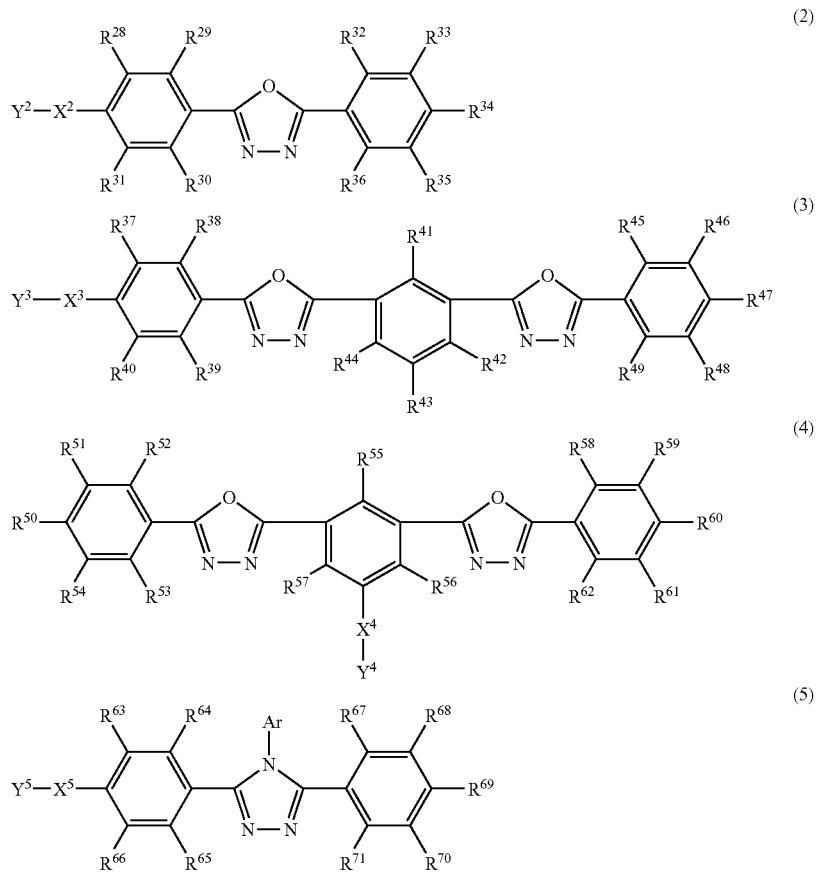

(In formulae (2) to (5), each of $R^{28}$-$R^{71}$ has the same definition as $R^1$ in the formula (1); within each of the groups $R^{28}$-$R^{31}$, $R^{32}$-$R^{36}$, $R^{37}$-$R^{40}$, $R^{42}$-$R^{44}$, $R^{45}$-$R^{49}$, $R^{50}$-$R^{54}$, $R^{58}$-$R^{62}$, $R^{63}$-$R^{66}$ and $R^{67}$-$R^{71}$, two groups bonding to adjacent carbon atoms in a benzene ring may bond to each other forming a fused ring; $X^2$-$X^5$ each has the same definition as $X^1$ in the formula (1); and $Y^2$-$Y^5$ each has the same definition as $Y^1$ in the formula (1). In the formula (5), Ar represents a phenyl group or a naphthyl group.)

[4] The organic electroluminescence device as described in any one of [1] to [3], wherein the phosphorescent compound is an iridium complex.

[5] An image display device comprising the organic EL device as described in any one of [1] to [4].

[6] An area light source comprising the organic EL device as described in any one of [1] to [4].

EFFECT OF THE INVENTION

According to the present invention, there can be provided an organic EL device with which the production process is simplified, enlargement of the area is realized, and high luminous efficiency and high durability are attained.

BEST MODES FOR CARRYING OUT THE INVENTION

Figure 1:
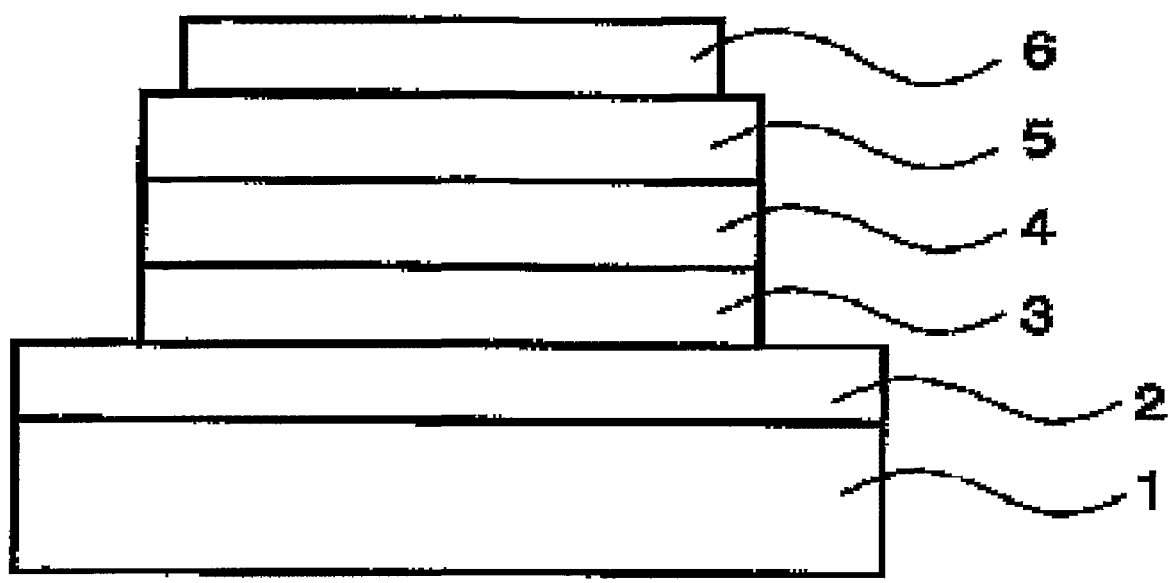
FIG. 1 shows a cross-sectional view of an example of organic EL device according to the present invention.
1: glass substrate
2: anode
3: hole transport layer
4: light emitting layer
5: electron transport layer
6: cathode

The present invention will be described in detail hereinbelow.

The organic EL device according to the present invention comprises one layer or two or more layers of organic layer sandwiched between an anode and a cathode, and at least one of the organic layers comprises a phosphorescent compound and a specific polymer.

1. Polymer

The polymer used in the present invention is obtained by copolymerizing a monomer represented by the formula (1) and a monomer having specific heterocycle(s). In polymerization to obtain the above-mentioned polymer, there may be used one or two or more monomers represented by the formula (1) and one or two or more monomers having the heterocycle in combination.

Since the monomer represented by the formula (1) is a hole transport compound, while the monomer having the heterocycle(s) is an electron transport compound, the polymer used in the present invention has both hole-transporting sites and electron-transporting sites. Accordingly, in the organic EL device according to the present invention, holes and electrons efficiently recombine on a phosphorescent compound which is located in the same organic layer as the above-mentioned polymer, and high luminous efficiency can be thus attained.

The monomer represented by the formula (1) is a triphenylamine derivative. Using a polymer containing a structural unit derived from this monomer, high luminous efficiency and high durability can be attained when an organic layer is formed of the polymer and the phosphorescent compound.

In the formula (1), $R^1$-$R^{27}$ each represents independently a hydrogen atom, a halogen atom, a cyano group, an amino group, an alkyl group having 1 to 10 carbon atoms or an alkoxy group having 1 to 10 carbon atoms.

The halogen atom includes a fluorine atom, a chlorine atom, a bromine atom an iodine atom.

As the alkyl group having 1 to 10 carbon atoms, there may be mentioned, for example, a methyl group, an ethyl group, a propyl group, an isopropyl group, a butyl group, an isobutyl group, a tertiary butyl group, an amyl group and a hexyl group.

As the alkoxy group having 1 to 10 carbon atoms, there may be mentioned, for example, a methoxy group, an ethoxy group, a propoxy group, an isopropoxy group, isobutoxy group and a tertiary butoxy group.

Among these, preferably each of $R^1$-$R^{27}$ is independently a hydrogen atom, a fluorine atom or a linear alkyl group having 1 to 8 carbon atoms.

Among $R^1$-$R^4$, two groups bonding to adjacent carbon atoms in a benzene ring may bond to each other to form a fused ring. It is the same also with each of $R^5$-$R^9$, $R^{10}$-$R^{14}$ and $R^{15}$-$R^{19}$ as $R^1$-$R^4$. Among these, a preferred monomer is a monomer wherein $R^{10}$ and $R^{11}$ bond to each other and $R^8$ and $R^9$ bond to each other to form a fused ring, respectively.

$X^1$ is a linking group and represents a single bond, an oxygen atom (—O—), a sulfur atom (—S—), —SO—, —SO$_2$—, —NR— (R represents a hydrogen atom, an alkyl group having 1 to 4 carbon atoms or a phenyl group), —CO— or a divalent organic group having 1 to 20 carbon atoms (the organic group may be substituted with an atom or a group selected from the group consisting of an oxygen atom (—O—), a sulfur atom (—S—), —SO—, —SO$_2$—, —NR— (R represents a hydrogen atom, an alkyl group having 1 to 4 carbon atoms or a phenyl group) and —CO—). $X^1$ may contain one or two or more oxygen atoms (—O—), and it is the same also with sulfur atom (—S—), —SO—, —SO$_2$—, —NR— and —CO—. Further, $X^1$ may contain two or more kinds of atom or group selected from the group consisting of an oxygen atom (—O—), a sulfur atom (—S—), —SO—, —SO$_2$—, —NR— and —CO—.

Among these, $X^1$ is preferably a single bond, an oxygen atom (—O—) or linking groups represented by the following formulae (S1) to (S3). In the following formula (S1), n represents an integer from 0 to 5.

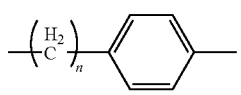
(S1)

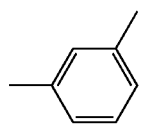
(S2)

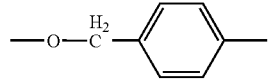
(S3)

Further, $X^1$ preferably bonds to the para-position with respect to the nitrogen atom that bonds to the phenyl group.

$Y^1$ represents a polymerizable functional group. The functional group may be capable of any of radical polymerization, cationic polymerization, anionic polymerization, addition polymerization or condensation polymerization. Among these, a radical polymerizable functional group is preferred because of easiness in production of a copolymer.

As $Y^1$, there may be mentioned, for example, an allyl group, an alkenyl group, an acrylate group, a methacrylate group, a urethane(meth)acrylate group such as a methacryloyloxyethylcarbamate group, a vinylamide group and derivatives thereof. Among these, an alkenyl group is preferred.

As the partial structure composed of $X^1$ and $Y^1$, specifically, partial structures represented by the following formulae (A1) to (A12) are preferred. Among these, partial structures represented by the following formulae (A1), (A5), (A8) and (A12) are further preferred because of easiness in introduction of the functional group.

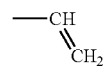
(A1)

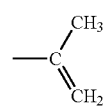
(A2)

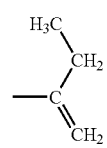
(A3)

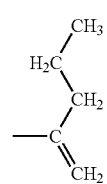
(A4)

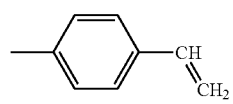
(A5)

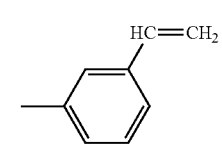
(A6)

-continued
(A7)
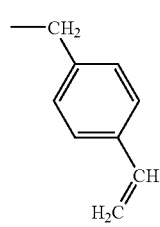
(A8)
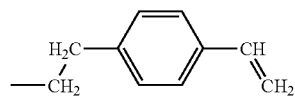
(A9)
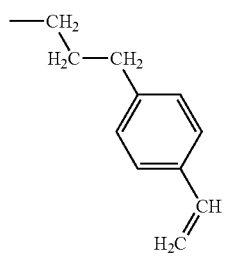
(A10)
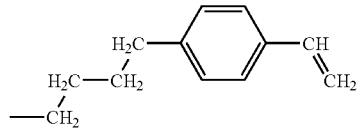
(A11)
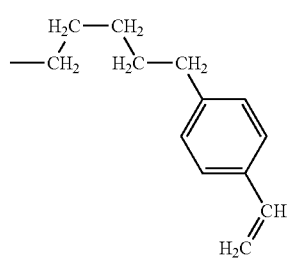
(A12)
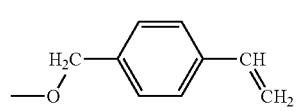
p represents 0 or 1.
As the monomer represented by the formula (1), specifically, monomers represented by the following formulae (B1) to (B6) are preferably used, and monomers represented by the following formulae (B1), (B2) and (B5) are more preferably used from the viewpoint of carrier mobility in the polymer.
(B1)
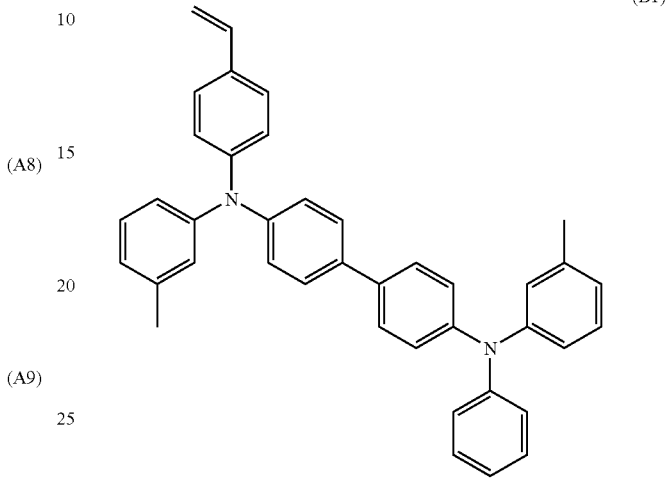
(B2)
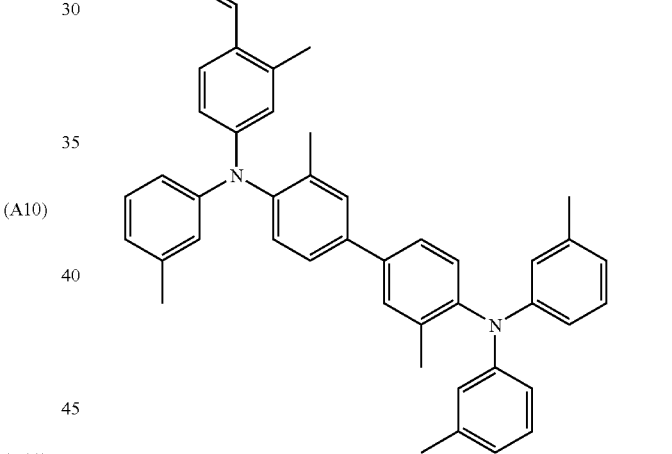
(B3)
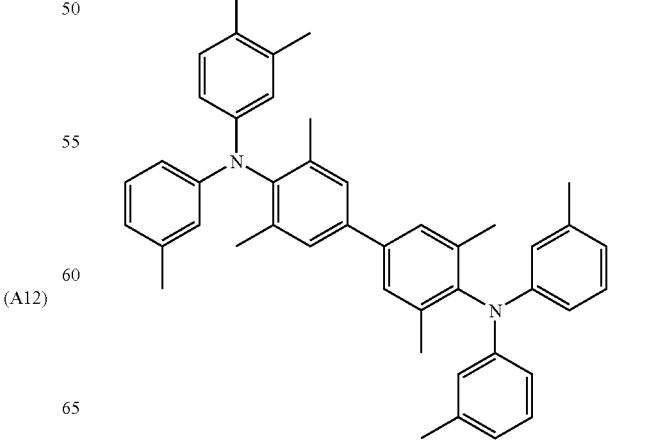

-continued

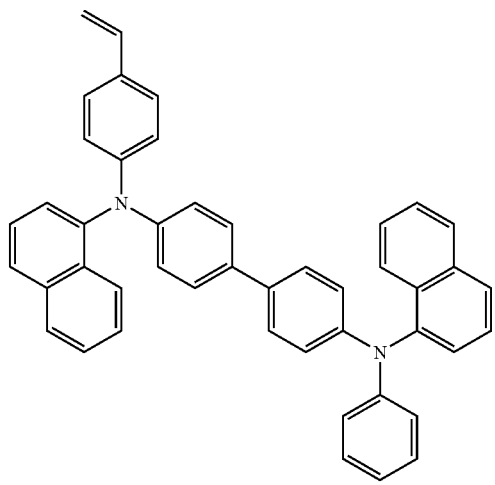
(B4)

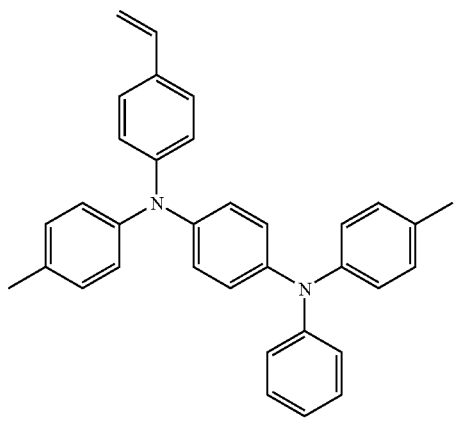
(B5)

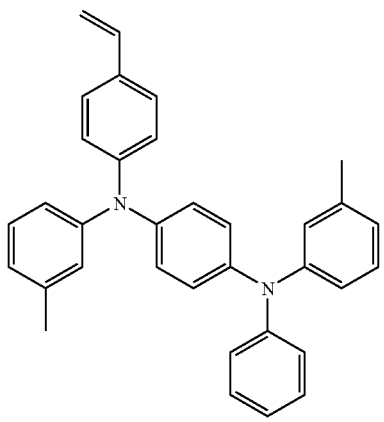
(B6)

In the monomer having heterocycle (s) used in the present invention, the heterocycle(s) each contains two or more heteroatoms. The monomer may contain one or two or more of such heterocycles. Using a polymer containing a structural unit derived from the above-mentioned monomer, high luminous efficiency and high durability can be attained when an organic layer is formed of the polymer and the phosphorescent compound.

As the heterocycle, there may be mentioned, for example, imidazole, pyrazole, pyridazine, pyrimidine, pyrazine, oxadizole, thiazole, isoxazole, isothiazole, triazole, tetrazole, oxadiazole, thiadiazole, and fused-rings derived therefrom.

Among these, oxadiazole and triazole are preferred. Namely, as the monomer having heterocycle(s), an oxadiazole derivative and a triazole derivative are preferred.

As the monomer having heterocycle(s), monomers represented by the formulae (2) to (5) are more preferred.

In the formulae (2) to (5), each of $R^{28}$-$R^{71}$ has the same definition as $R^1$ in the formula (1). Among these, preferably, each of $R^{28}$-$R^{71}$ is independently a hydrogen atom, a halogen atom, a linear alkyl group having 1 to 8 carbon atoms or a tertiary butyl group. In the formula (2), $R^{34}$ is more preferably a tertiary butyl group. In the formula (3), $R^{47}$ is more preferably a tertiary butyl group.

In $R^{28}$-$R^{31}$, two groups bonding to adjacent carbon atoms in a benzene ring may bond to each other to form a fused ring. It is the same also with each of $R^{32}$-$R^{36}$, $R^{37}$-$R^{40}$, $R^{42}$-$R^{44}$, $R^{45}$-$R^{49}$, $R^{50}$-$R^{54}$, $R^{58}$-$R^{62}$, $R^{63}$-$R^{66}$ and $R^{67}$-$R^{71}$ as $R^{28}$-$R^{31}$. For the formula (2), a preferred monomer is a compound wherein $R^{28}$ and $R^{29}$ bond to each other and $R^{32}$ and $R^{33}$ bond to each other to form a fused ring, respectively.

In the formula (5), Ar represents a phenyl group or a naphthyl group.

$X^2$ has the same definition as $X^1$ in the formula (1) and the preferred ranges for $X^2$ are also the same as those for $X^1$. It is the same also with $X^3$-$X^5$ as $X^2$.

$Y^2$ has the same definition as $Y^1$ in the formula (1) and the preferred ranges for $Y^2$ are also the same as those for $Y^1$. It is the same also with $Y^3$-$Y^5$ as $Y^2$.

As a partial structure composed of a combination of $X^2$ and $Y^2$; $X^3$ and $Y^3$; $X^4$ and $Y^4$; or $X^5$ and $Y^5$, specifically, partial structures represented by the formulae (A1) to (A12) are preferred. Among these, partial structures represented by the formulae (A1), (A5), (A8) and (A12) are further preferred because of easiness in introduction of the functional group into the monomer having heterocycle(s).

As the monomer having heterocycle(s), specifically, monomers represented by the following formulae (C1) to (C4) are preferably used and monomers represented by the following formulae (C1) to (C3) are more preferably used from the viewpoint of carrier mobility in the polymer.

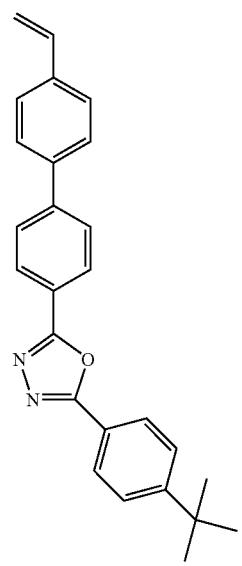
(C1)

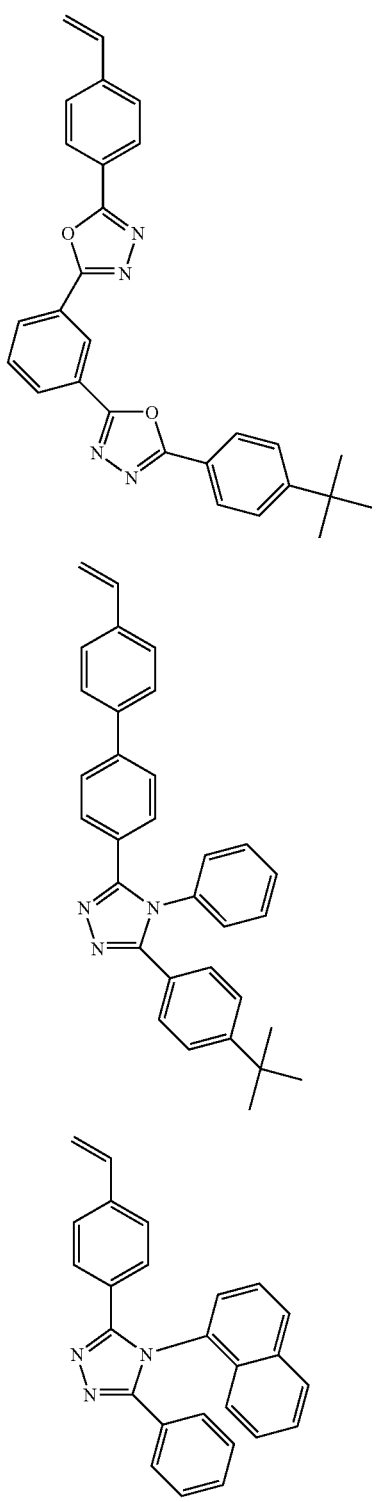

As the polymer used in the present invention, specifically, there may be preferably used a polymer containing structural units derived from the formula (B2) and from the formula (C1), a polymer containing structural units derived from the formula (B5) and from the formula (C2) and a polymer containing structural units derived from the formula (B1) and from the formula (C3). Using these polymers, holes and electrons more efficiently recombine on a phosphorescent compound, yielding higher luminous efficiency. Further, these polymers can form an organic layer with uniform distribution together with a phosphorescent compound, and thus provide an organic EL device with excellent durability.

The above-mentioned polymers may additionally contain a structural unit derived from another polymerizable compound within the range that is not incompatible with the purpose of the present invention. As such a polymerizable compound, there may be mentioned, compounds having no carrier transport ability, for example, alkyl esters of (meth) acrylic acid such as methyl acrylate and methyl methacrylate; styrene and derivatives thereof; and the like, although not limited thereto.

The weight-average molecular weight of the polymer used in the present invention is preferably 1,000 to 2,000,000, and more preferably 5,000 to 1,000,000. In the present specification, the molecular weight refers to a molecular weight in terms of the polystyrene as measured by GPC (gel permeation chromatography) method. When the molecular weight is in the above range, the polymer is soluble in an organic solvent, and this point is desirable because a uniform thin film can be obtained.

The above-mentioned polymer may be any of a random copolymer, a block copolymer and an alternate copolymer.

In the polymer, the content of the structural unit derived from the monomer represented by the formula (1) is in the range of preferably 5 to 95 mol %, more preferably 20 to 80 mol %, and the content of the structural unit derived from the monomer having heterocycle (s) is in the range of preferably to 95 mol %, more preferably 20 to 80 mol % (Here, the total content of the structural unit derived from the monomer represented by the formula (1) and the monomer having heterocycle(s) is 100 mol %.).

As the polymerization method for obtaining the polymer, all of radical polymerization, cationic polymerization, anionic polymerization and addition polymerization are employable. Among these, radical polymerization is preferred. The polymer is preferably prepared by polymerization using the monomers such that the contents of the units fall in the above ranges.

2. Phosphorescent Compound

The phosphorescent compound used in the present invention is not particularly limited as long as it is a low molecular weight compound that emits phosphorescence at room temperature. In the present invention, the phosphorescent compounds may be used singly or in combination of two or more kinds.

In the organic layer containing a phosphorescent compound and a polymer used for the organic EL device according to the present invention, the above-mentioned phosphorescent compound is present in a state wherein it is dispersed in a matrix composed of the polymer. Accordingly, light emission that is usually difficult to use, that is, light emission via the triplet excited state of the phosphorescent compound, can be obtained, and high luminous efficiency is thus obtained using the above-mentioned organic layer.

As the phosphorescent compound, a transition metal complex is preferably used. The transition metal used in this transition metal complex is a metal atom belonging to any one of the first transition series, that is, from Sc (atomic number 21) to Zn (atomic number 30); the second transition series, that is, from Y (atomic number 39) to Cd (atomic number 48); and the third transition series, that is, from Hf (atomic number 72) to Hg (atomic number 80) in the periodic table. Among these, the transition metal complex is preferably a palladium complex, an osmium complex, an iridium complex, a platinum complex or a gold complex; more preferably an iridium complex or a platinum complex; and most preferably an iridium complex.

As the iridium complex, specifically, complexes represented by the following formulae (E-1) to (E-34) are preferred, and complexes represented by the following formulae (E-1), (E-2), (E-17) and (E-32) to (E-34) are more preferred because they provide an organic EL device with long lifetime as well as high luminous efficiency.

E-1
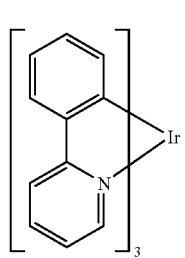

E-2
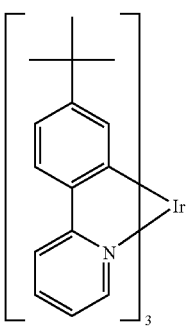

E-3
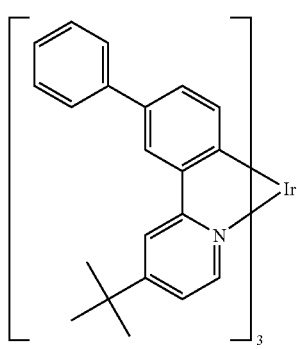

E-4
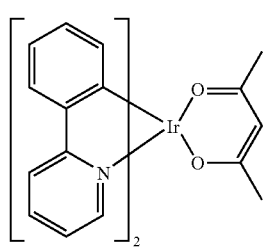

-continued

E-5
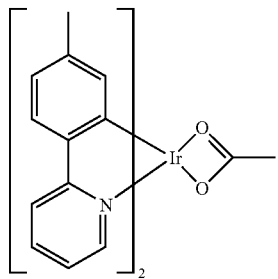

E-6
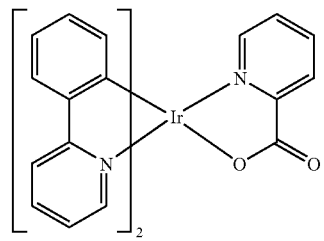

E-7
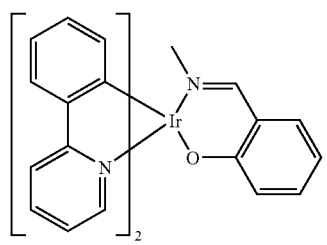

E-8
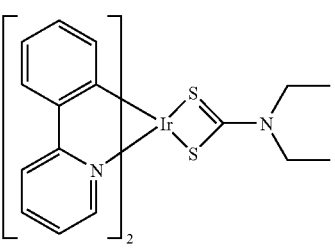

E-9
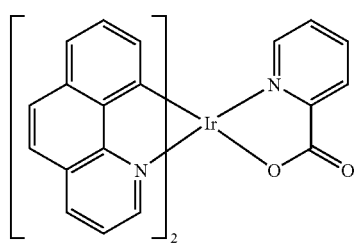

E-10
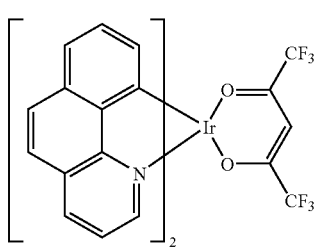

-continued
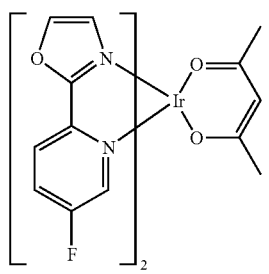  E-11
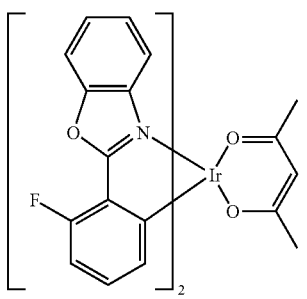  E-12
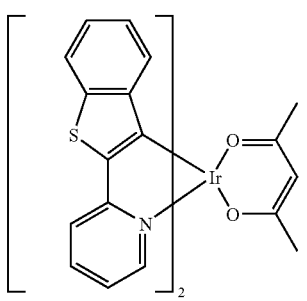  E-13
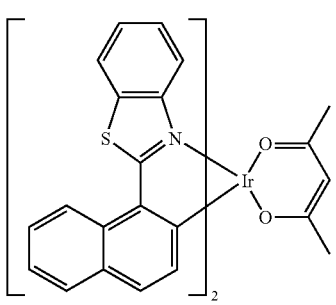  E-14
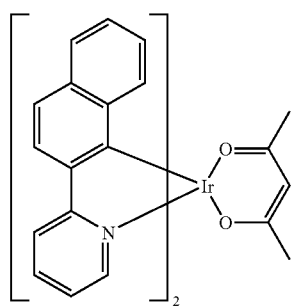  E-15
-continued
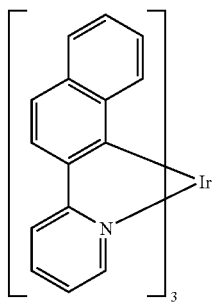  E-16
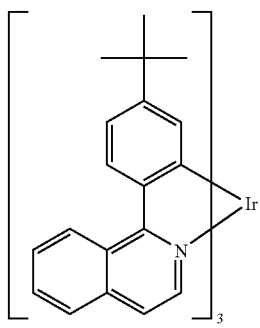  E-17
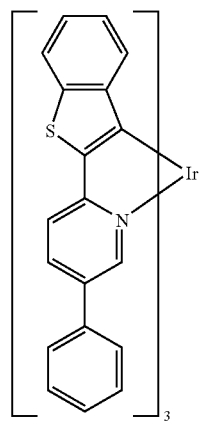  E-18
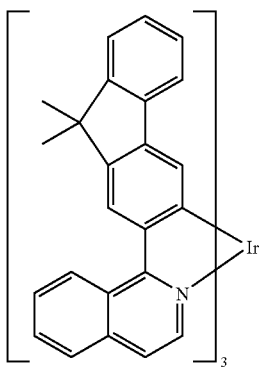  E-19

-continued
E-20
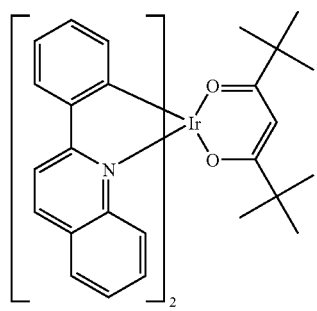
E-21
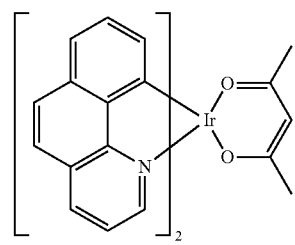
E-22
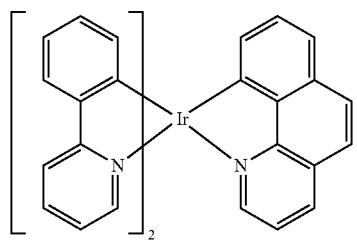
E-23
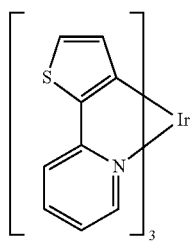
E-24
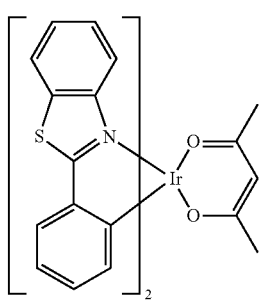
-continued
E-25
E-26
E-27
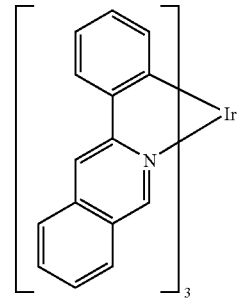
E-28
E-29
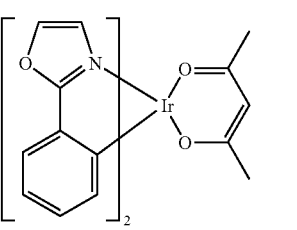

-continued

E-30 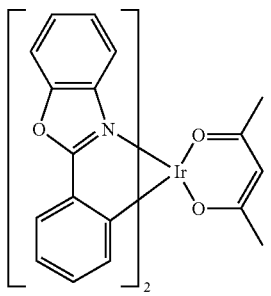

E-31 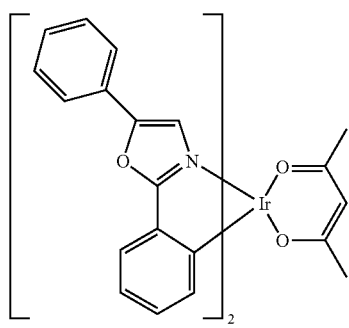

E-32 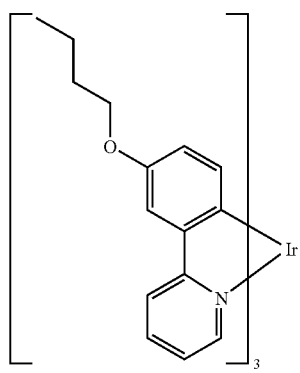

E-33 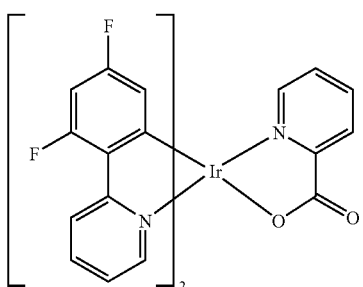

-continued

E-34 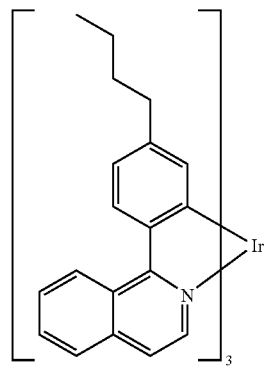

The iridium complexes represented by the formulae (E-1) to (E-34) can be obtained by publicly known methods.

3. Organic EL Device (Organic Layer Containing a Phosphorescent Compound and a Polymer)

The organic EL device according to the present invention comprises one layer or two or more layers of organic layer sandwiched between an anode and a cathode, wherein at least one of the organic layer contains the above-mentioned phosphorescent compound and the above-mentioned polymer.

FIG. 1 illustrates one example of structure of an organic EL device according to the present invention, although the structure of organic EL device according to the present invention is not limited thereto. In FIG. 1, between an anode (2) formed on a transparent substrate (1) and a cathode (6), a hole transport layer (3), a light emitting layer (4) and an electron transport layer are provided in this order. In the organic EL device, for example, 1) a hole transport layer/a light emitting layer, 2) a light emitting layer/an electron transport layer or 3) only a light emitting layer may be provided between the anode (2) and the cathode (6). Two or more light emitting layers may be laminated.

In the device, the organic layer containing the phosphorescent compound and the polymer can be used as a light emitting layer that has both hole transport ability and electron transport ability. For this reason, the organic layer has an advantage that an organic EL device with high luminous efficiency can be produced even without providing a layer comprising other organic material.

As a combination of compounds contained in the organic layer, particularly preferred combinations are, specifically, a combination of a polymer containing structural units derived from the formula (B2) and the formula (C1) and an iridium complex represented by the formula (E-2);

a combination of a polymer containing structural units derived from the formula (B5) and the formula (C2) and an iridium complex represented by the formula (E-33);

a combination of a polymer containing structural units derived from the formula (B1) and the formula (C3) and an iridium complex represented by the formula (E-17); and a combination of a polymer containing structural units derived from the formula (B1) and the formula (C3) and an iridium complex represented by the formula (E-34).

Using these combinations provides an organic layer with more uniform distribution, and thus a device with higher luminous efficiency as well as excellent durability.

The organic layer desirably comprises the phosphorescent compound in an amount of preferably 0.1 to 50 parts by weight, more preferably 1 to 20 parts by weight, relative to 100 parts by weight of the polymer.

The production method of the organic layer is not particularly limited. For example, the organic layer can be produced as follows. First, a solution is prepared wherein the above-mentioned phosphorescent compound and the above-mentioned polymer are dissolved. The solution is preferably prepared by using the phosphorescent compound and the polymer such that the content of the phosphorescent compound fall in the above range. As solvent used for preparing this solution, although not particularly limited, there may be used, for example, chlorinated solvents such as chloroform, methylene chloride and dichloroethane; ethereal solvents such as tetrahydrofuran and anisole; aromatic hydrocarbon solvents such as toluene and xylene; ketone-type solvents such as acetone and methyl ethyl ketone; and ester-type solvents such as ethyl acetate, butyl acetate and ethyl cellosolve acetate. Next, using the solution thus prepared, a film is formed on a substrate by inkjet printing, spin coating, dip coating, printing or the like. The total concentration of the phosphorescent compound and the polymer in the solution is preferably, for example, in the case of spin coating or dip coating, 0.1 wt % to 10 wt %, although the preferred range depends on compounds to be used and conditions for film formation. Since a film of the above-mentioned organic layer is thus readily formed, the production process can be simplified and the area of the device can be increased.

(Other Materials)

Each of the above-mentioned layers may be formed with a polymer material mixed as a binder. As such polymer materials, there may be mentioned, for example, poly(methyl methacrylate), polycarbonate, polyester, polysulfone and polypheyleneoxide.

Further, as the material used for each of the above-mentioned layers, there may be mixed materials having different functions, for example, a luminescent material, a hole transport material, an electron transport material and others, to form each layer. In the above-mentioned organic layer containing the phosphorescent compound and the polymer, another hole transport material and/or another electron transport material may also be contained so as to enhance carrier transport ability. As such a transport material, either a low molecular weight compound or a polymer compound may be used.

As a hole transport material that forms the hole transport layer or the hole transport material that is mixed into the light emitting layer, there may be mentioned, for example, non-polymeric triphenylamine derivatives such as TPD (N,N'-dimethyl-N,N'-(3-methylphenyl)-1,1'-biphenyl-4,4'-diamine), α-NPD (4,4'-bis[N-(1-naphthyl)-N-phenylamino] biphenyl) and m-MTDATA (4,4',4''-tris(3-methylphenylphenylamino)triphenylamine); polyvinylcarbazole; polymers obtained by polymerization of the triphenylamine derivative by introducing a polymerizable functional group; and fluorescent light emitting polymers such as poly(p-phenylenevinylene) and poly(dialkylfluorene). As the above-mentioned polymer, there may be mentioned, for example, a polymer having a triphenylamine skeleton as disclosed in JP-A-8-157575. The hole transport materials may be used singly or in combination of two or more kinds, and different hole transport materials may be used in a laminated structure. The thickness of the hole transport layer is preferably 1 nm to 5 μm, more preferably 5 nm to 1 μm, particularly preferably 10 nm to 500 nm, although general limitation cannot be given since the preferred thickness depends on the conductivity or other characteristics of the hole transport layer.

As the electron transport material that forms the electron transport layer or the electron transport material that is mixed into the light emitting layer, there may be mentioned, for example, non-polymeric materials including metal complexes of quinolinol derivatives such as $Alq_3$ (aluminum trisquinolinolate), oxadiazole derivatives, triazole derivatives, imidazole derivatives, triazine derivatives and triarylborane derivatives; and polymers obtained by polymerization of the low molecular weight electron transport compound by introducing a polymerizable functional group. As the above-mentioned polymer, there may be mentioned, for example, polyPBD as disclosed in JP-A-10-1665. The electron transport materials may be used singly or in combination of two or more kinds, and different electron transport materials may be used in a laminated structure. The thickness of the electron transport layer is preferably 1 nm to 5 μm, more preferably 5 nm to 1 μm, particularly preferably 10 nm to 500 nm, although general limitation cannot be given since the preferred thickness depends on the conductivity or other characteristics of the electron transport layer.

Furthermore, a hole block layer may be formed adjacent to cathode side of the light emitting layer so that passage of holes through the light emitting layer can be suppressed, resulting in efficient recombination of holes and electrons in the light emitting layer. To form the hole block layer, publicly known materials such as triazole derivatives, oxadiazole derivatives and phenanthroline derivatives can be used.

Between the anode and the hole transport layer or between the anode and the organic layer laminated adjacent to the anode, a buffer layer may be provided to reduce injection barrier in injection of holes. To form the buffer layer, publicly known materials such as copper phthalocyanine and a mixture of polyethylenedioxythiophene and polystyrenesulfonic acid (PEDOT:PSS) can be used.

Between the cathode and the electron transport layer or between the cathode and the organic layer laminated adjacent to the cathode, an insulating layer having a thickness of 0.1 nm to 10 nm may be provided to improve efficiency of electron injection. To form the insulating layer, publicly known materials such as lithium fluoride, magnesium fluoride, magnesium oxide and alumina can be used.

As the anode material, publicly known transparent conductive materials, for example, ITO (indium tin oxide), tin oxide, zinc oxide, conductive polymers such as polythiophene, polypyrrole and polyaniline can be used. The surface resistance of electrode made of this transparent conductive material is preferably 1Ω/□ to 50Ω/□ (Ohm/square). The thickness of anode is preferably 50 nm to 300 nm.

As the cathode material, publicly known materials, for example, alkaline metal such as Li, Na, K and Cs; alkaline earth metal such as Mg, Ca and Ba; Al; MgAg alloy; and alloy of Al and an alkali metal or an alkaline earth metal such as AlLi and AlCa can be used. The thickness of the cathode is preferably 10 nm to 1 μm, more preferably 50 nm to 500 nm. When highly active metal such as alkali metal and alkaline earth metal is used as the cathode, the thickness of cathode is preferably 0.1 nm to 100 nm, more preferably 0.5 nm to 50 nm. Further, in this case, an air-stable metal layer is laminated on this cathode for protecting the cathode metal. As metal that forms the above-mentioned metal layer, there may be mentioned, for example, Al, Ag, Au, Pt, Cu, Ni and Cr. The thickness of the metal layer is preferably 10 nm to 1 μm, more preferably 50 nm to 500 nm.

As the substrate of the organic EL device according to the present invention, an insulating substrate that is transparent at the emission wavelength of the luminescent material can be used. As the insulating substrate, transparent plastic such as PET (polyethylene terephthalate) and polycarbonate can be used as well as glass.

As film-forming process of the hole transport, light emitting and electron transport layers, there may be used, for example, resistance heating vapor deposition, electron beam vapor deposition, sputtering, inkjet printing, spin coating, printing, spray coating and dispensing. In the case of low molecular weight compounds, resistance heating vapor deposition and electron beam vapor deposition are preferably used, while in the case of polymer materials, inkjet printing, spin coating and printing are preferably used.

As film-forming process of the above-mentioned anode material, there may be used, for example, electron beam vapor deposition, sputtering, chemical reaction and coating, while as film-forming process of the above-mentioned cathode material, there may be used, for example, resistance heating vapor deposition, electron beam vapor deposition, sputtering and ion plating.

4. Use

The organic EL device according to the present invention can be preferably used for image display devices through forming pixels by a matrix system or by a segment system by publicly known methods. The organic EL device can be also preferably used as area light source without forming pixels.

Specifically, the organic EL device according to the present invention can be preferably used for display devices such as computer, television set, portable terminal, portable telephone, car navigation and viewfinder of video camera, backlight, electrophotograph, illumination light source, recording light source, exposure light source, write light source, indicator, sign board, interior goods, optical communication and the like.

In the following, the present invention will be explained more specifically with examples, but the present invention is not limited to these examples.

EXAMPLES

Synthetic Example 1

Synthesis of Polymer (I)

In a closed vessel were put 500 mg of the compound represented by the formula (B2) (synthesized by the method described in Patent document 2) and 500 mg of the compound represented by the formula (C1) (synthesized by the method described in JP-A-10-1665), and dehydrated toluene (9.9 mL) was added here. Next, a toluene solution (0.1 M, 198 μL) containing V-601 (Wako Pure Chemical Industries Ltd.) was added, and the content was deaerated by five freeze-pump-thaw cycles. The vessel was sealed with the vacuum condition kept and the reaction solution was stirred at 60° C. for 60 hr. After the reaction was completed, the reaction solution was dropwise added to acetone (500 mL) to obtain precipitate. This precipitate was purified twice by re-precipitation with toluene-acetone and dried at 50° C. in vacuum overnight to obtain polymer (I).

The weight-average molecular weight (Mw) of polymer (I) was 68100 and its molecular weight distribution index (Mw/Mn) was 1.96. In polymer (I), the ratio of the number of a structural unit derived from the compound represented by the formula (B2) (x) and the number of a structural unit derived from the compound represented by the formula (C1) (y) (X:Y), as estimated from the results determined by $^{13}$C-NMR spectra, is 40:60.

Synthetic Example 2

Synthesis of Polymer (II)

(2-1) Synthesis of the Compound Represented by the Formula (C2)

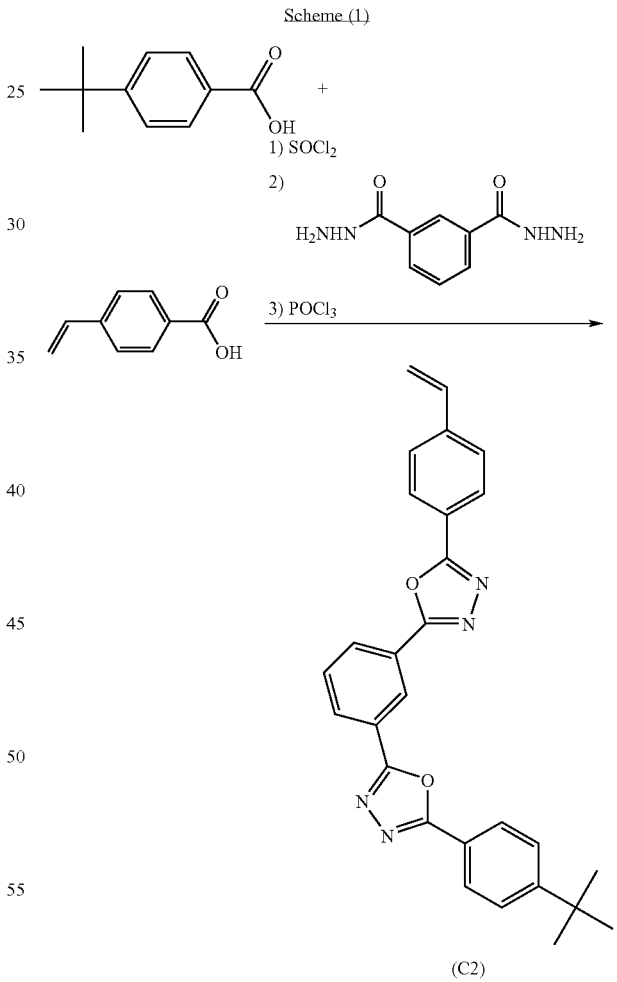

This compound was synthesized as shown in Scheme (1). To a mixture of 4-tert-butyl benzoic acid (5.0 g, 28 mmol) and 4-vinylbenzoic acid (4.2 g, 28 mmol), thionyl chloride (30 mL) was added and the mixture was heated under reflux for 3 hr. The resultant solution was reduced to dryness. The residue was dissolved by adding N,N-dimethylformamide (DMF) (20 mL) and pyridine (4.5 g, 57 mmol). To this solution isophthalic dihydrazide (5.4 g, 28 mmol) was added and the mixture was stirred at room temperature for 5 hr. The reaction solution was poured into water (500 mL) and the resultant precipitate was collected by filtration and dried. To the solid thus obtained, phosphoryl chloride (15 g) and chloroform (30 mL) were added and the resultant mixture was heated under reflux for 3 hr. The reaction solution was poured into saturated aqueous sodium carbonate solution (500 mL) and chloroform (100 mL) was added here. The organic layer was concentrated in vacuo. To the residue, methanol was added and the mixture was cooled to −50° C. The resultant solid was collected by filtration and dried. This solid was further purified by silica-gel column chromatography to obtain the compound represented by the formula (C2) (1.1 g, 2.5 mmol).

Compound (C2) was characterized by elemental analysis and mass spectrometric analysis. The results are shown below.

Elemental analysis: Calculated for $C_{28}H_{24}N_4O_2$: C, 74.98; H, 5.39; N, 12.49. Found: C, 75.30; H, 5.18; N, 12.26.

Mass spectrometric analysis (EI): 448 ($M^+$).

(2-2) Synthesis of Polymer (II)

The polymer (II) was obtained in the same way as Synthetic example 1 except that the compound represented by the formula (B5) (synthesized by the method described in Patent document 2) and the compound represented by the formula (C2) were used instead of the compound represented by the formula (B2) and the compound represented by the formula (C1).

The weight-average molecular weight (Mw) of polymer (II) was 100500 and its molecular weight distribution index (Mw/Mn) was 2.33. In polymer (II), the ratio of the number of a structural unit derived from the compound represented by the formula (B5) (x) and the number of a structural unit derived from the compound represented by the formula (C2) (y) (X:Y), as estimated from the results determined by $^{13}C$-NMR spectra, is 48:52.

Synthetic Example 3

Synthesis of Polymer (III)

(3-1) Synthesis of the Compound Represented by the Formula (C3)

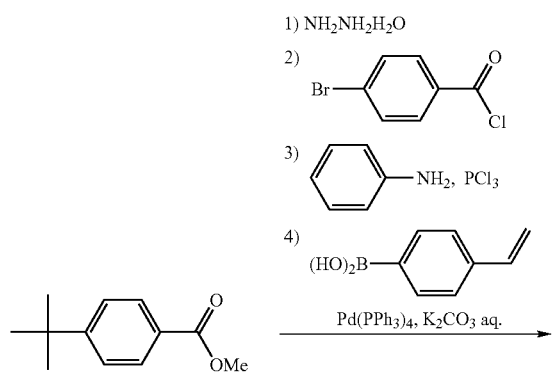

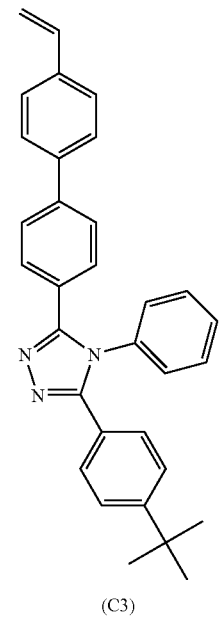

(C3)

This compound was synthesized as shown in Scheme (2). Methyl 4-tert-butylbenzoate (3.5 g, 18 mmol) was dissolved in ethanol (50 mL). Hydrazine monohydrate (2.0 g, 40 mmol) was added here and the solution was heated under reflux for 10 hr. The resultant reaction mixture was poured into water (300 mL) and the solid was collected by filtration and dried. To this sold were added pyridine (20 mL) and 4-bromobenzoyl chloride (4.4 g, 20 mmol) and the mixture was stirred at room temperature for 5 hr. The reaction solution was poured into water (300 mL) and the resultant solid was collected by filtration and dried. To this solid were added o-dichlorobenzene (20 mL), aniline (1.8 g, 19 mmol) and phosphorous trichloride (6.5 g, 47 mmol), and the mixture was heated under reflux for 3 hr. The reaction solution was poured into water (300 mL), organic materials were extracted with chloroform and the extract was concentrated in vacuo. To the residue were added 1,2-dimethoxyethane (50 mL), 4-vinylphenylboronic acid (3.0 g, 20 mmol), tetrakis(triphenylphosphine)palladium (0.23 g, 0.20 mmol) and an aqueous solution (50 mL) containing sodium carbonate (6.3 g, 59 mmol) and the mixture was heated under reflux for 3 hr. After the reaction solution was cooled down to room temperature, the organic layer was concentrated in vacuo and the residue was purified with silica-gel column chromatography to obtain the compound represented by the formula (C3) (2.8 g, 6.1 mmol).

Compound (C3) was characterized by elemental analysis and mass spectrometric analysis. The results are shown below.

Elemental analysis: Calculated for $C_{32}H_{29}N_3$: C, 84.36; H, 6.42; N, 9.22. Found: C, 84.57; H, 6.33; N, 9.04.

Mass spectrometric analysis (EI): 455 ($M^+$).

(3-2) Synthesis of Polymer (III)

The polymer (III) was obtained in the same way as Synthetic example 1 except that the compound represented by the formula (B1) (synthesized by the method described in Patent document 2) and the compound represented by the formula (C3) were used instead of the compound represented by the formula (B2) and the compound represented by the formula (C1).

The weight-average molecular weight (Mw) of polymer (III) was 55900 and its molecular weight distribution index (Mw/Mn) was 2.04. In polymer (III), the ratio of the number of a structural unit derived from the compound represented by the formula (B1) (x) and the number of a structural unit derived from the compound represented by the formula (C3) (y) (X:Y), as estimated from the results determined by $^{13}$C-NMR spectra, is 45:55.

Synthetic Example 4

Synthesis of Iridium Complex (E-2)

concentrated in vacuo. The resultant crude product was purified with silica-gel column chromatography to obtain compound (a) (7.5 g, 35 mmol).

(4-2) Synthesis of Iridium Complex (b)

To a mixture of compound (a) (4.9 g, 23 mmol) and iridium trichloride trihydrate (4.0 g, 11 mmol), 2-ethoxyethanol (75 mL) and water (25 mL) were added and this mixture was heated under reflux for 24 hr. The resultant precipitate was collected by filtration, washed with cold methanol and dried to obtain iridium complex (b) (7.0 g, 5.4 mmol).

(4-3) Synthesis of Iridium Complex (E-2)

To a mixture of iridium complex (b) (3.0 g, 2.3 mmol) and compound (a) (3.0 g, 14 mmol), glycerol (20 mL) was added and the mixture was heated with stirring at 200° C. for 24 hr. After the reaction solution was cooled down to room tem-

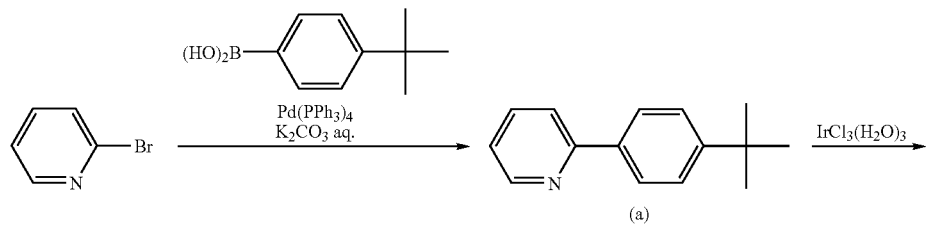

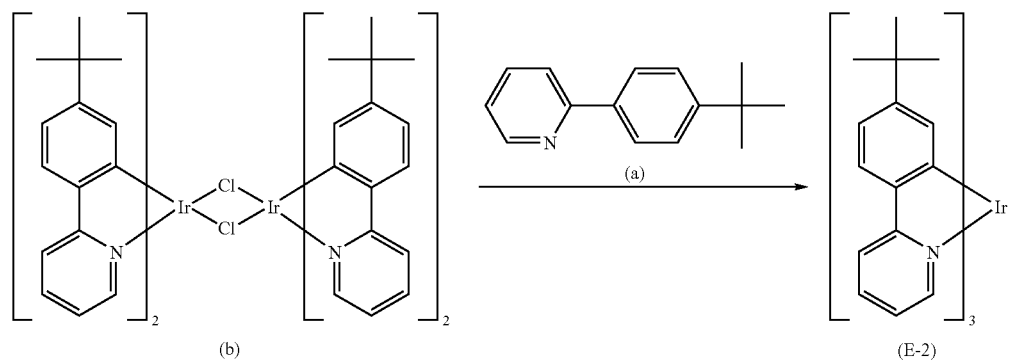

(4-1) Synthesis of Compound (a)

Compound (a) was synthesized as shown in Scheme (3). 2-Bromopyridine (6.0 g, 38 mmol), 4-tert-butylphenylboronic acid (6.8 g, 38 mmol), tetrakis(triphenylphosphine)palladium (0.50 g, 0.43 mmol), an aqueous solution (50 mL) containing potassium carbonate (14 g, 100 mmol) and 1,2-dimethoxyethane (50 mL) were mixed and this mixture was heated under reflux for 3 hr. After the reaction solution was cooled down to room temperature, ethyl acetate was added here. Two layers were separated and the organic layer was perature, water (200 mL) was added here and the resultant precipitate was collected by filtration and dried. The obtained crude product was purified with silica-gel column chromatography to obtain iridium complex (E-2) (1.6 g, 1.9 mmol).

Iridium complex (E-2) was characterized by elemental analysis and mass spectrometric analysis. The results are shown below.

Elemental analysis: Calculated for $C_{45}H_{48}IrN_3$: C, 65.66; H, 5.88; N, 5.11. Found: C, 65.73; H, 5.82; N, 5.06.

Mass spectrometric analysis (FAB): 823 (M$^+$).

Synthetic Example 5

Synthesis of Iridium Complex (E-17)

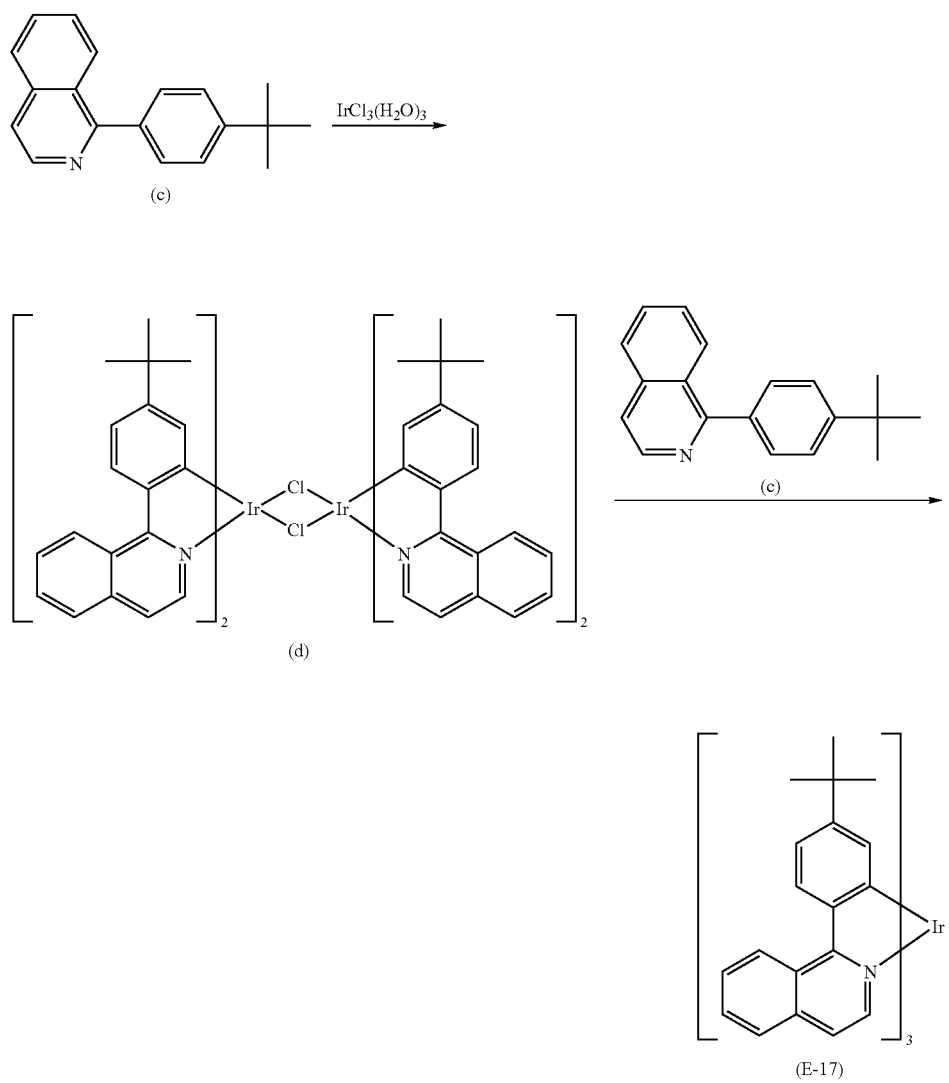

Complex (E-17) was synthesized as shown in Scheme (4). Compound (c) was synthesized by the same method as synthesis of compound (a) except that 1-chloroisoquinoline was used instead of 2-bromopyridine. Next, iridium complex (d) was synthesized by the same method as synthesis of iridium complex (b) except that compound (c) was used instead of compound (a). To a mixture of iridium complex (d) (1.20 g, 0.80 mmol) and compound (c) (1.0 g, 3.8 mmol), glycerol (20 mL) was added and the mixture was heated with stirring at 200° C. for 24 hr. After the reaction solution was cooled down to room temperature, and the resultant precipitate was collected by filtration and dried. The obtained crude product was purified with silica-gel column chromatography to obtain iridium complex (E-17) (0.30 g, 0.31 mmol).

Iridium complex (E-17) was characterized by elemental analysis and mass spectrometric analysis. The results are shown below.

Elemental analysis: Calculated for $C_{57}H_{54}IrN_3$: C, 70.34; H, 5.59; N, 4.32. Found: C, 70.51; H, 5.50; N, 4.19.

Mass spectrometric analysis (FAB): 973 (M$^+$).

Synthetic Example 6

Synthesis of Polymer (IV)

Polymer (IV) was obtained in the same way as Synthetic example 1 except that N-vinylcarbazole was used instead of the compound represented by the formula (B2).

The weight-average molecular weight (Mw) of polymer (IV) was 51000 and its molecular weight distribution index (Mw/Mn) was 2.31. In polymer (IV), the ratio of the number of a structural unit derived from N-vinylcarbazole (x) and the number of a structural unit derived from the compound represented by the formula (C1) (y) (X:Y), as estimated from the results determined by $^{13}$C-NMR spectra, is 67:33.

Synthetic Example 7

Synthesis of Polymer (V)

(7-1) Synthesis of Compound (f)

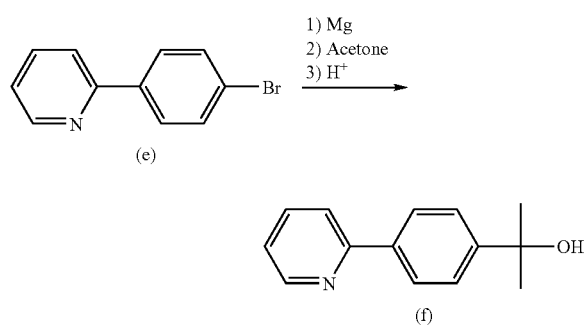

Compound (f) was synthesized as shown in Scheme (5). Compound (e) was synthesized by the same method as synthesis of compound (a) except that 4-bromophenylboronic acid was used instead of 4-tert-butylphenylboronic acid. To magnesium (0.48 g, 20 mmol) tetrahydrofuran (THF) (10 mL) was added and a THF (40 mL) solution containing compound (e) (4.0 g, 17 mmol) was added here dropwise over 1 hr. After addition the mixture was stirred at room temperature for additional 1 hr and then a THF (20 mL) solution containing acetone (3.0 g, 52 mmol) was added here dropwise with ice-cooling. After the mixture was stirred at room temperature for 1 hr, water (500 mL) was added to the resultant reaction solution. Organic materials were extracted with ethyl acetate and the organic extract was washed with water and brine and dried by adding magnesium sulfate. This solution was concentrated in vacuo and the residue was purified with silica-gel column chromatography to obtain compound (f) (2.1 g, 9.8 mmol).

(7-2) Synthesis of Iridium Complex (g)

Complex (g) was synthesized as shown in Scheme (6). To a mixture of iridium complex (b) (0.50 g, 0.30 mmol) and compound (f) (0.15 g, 0.70 mmol) glycerol (10 mL) was added and the mixture was heated with stirring at 200° C. for 12 hr. After the reaction solution was cooled down to room temperature, water (100 mL) was added here and the resultant precipitate was collected by filtration and dried. The obtained crude product was purified with silica-gel column chromatography to obtain iridium complex (g) (0.22 g, 0.27 mmol).

Iridium complex (g) was characterized by elemental analysis and mass spectrometric analysis. The results are shown below.

Elemental analysis: Calculated for $C_{44}H_{44}IrN_3$: C, 65.48; H, 5.50; N, 5.21. Found: C, 65.77; H, 5.36; N, 5.04.

Mass spectrometric analysis (FAB): 807 (M$^+$).

(7-3) Synthesis of Polymer (V)

To a closed vessel were put iridium complex (g) (80 mg), the compound represented by the formula (B2) (460 mg) and the compound represented by the formula (C1) (460 mg), and dehydrated toluene (9.9 mL) was added. Then a toluene solution (0.1 M, 198 µL) containing V-601 (Wako Pure Chemical Industries Ltd.) was added, and the content was deaerated by five freeze-pump-thaw cycles. The vessel was sealed with the vacuum condition kept and the reaction solution was stirred at 60° C. for 60 hr. After the reaction was completed, the reaction solution was dropwise added to acetone (500 mL) to obtain precipitate. This precipitate was purified twice by re-precipitation with toluene-acetone and dried at 50° C. in vacuum overnight to obtain polymer (V).

The weight-average molecular weight (Mw) of polymer (V) was 70500 and its molecular weight distribution index (Mw/Mn) was 1.86. In polymer (V), the ratio of the number of a structural unit derived from iridium complex (g) (z), the number of a structural unit derived from the compound represented by the formula (B2) (x) and the number of a structural unit derived from the compound represented by the formula (C1) (y) (Z:X:Y), as estimated from the results determined by elemental analysis using ICP-MS and $^{13}$C-NMR spectra, is 5:38:57.

Synthetic Example 8

Synthesis of Polymer (VI)

Polymer (VI) was obtained in the same way as Synthetic example 1 except that 9-ethyl-3-vinylcarbazole (synthesized

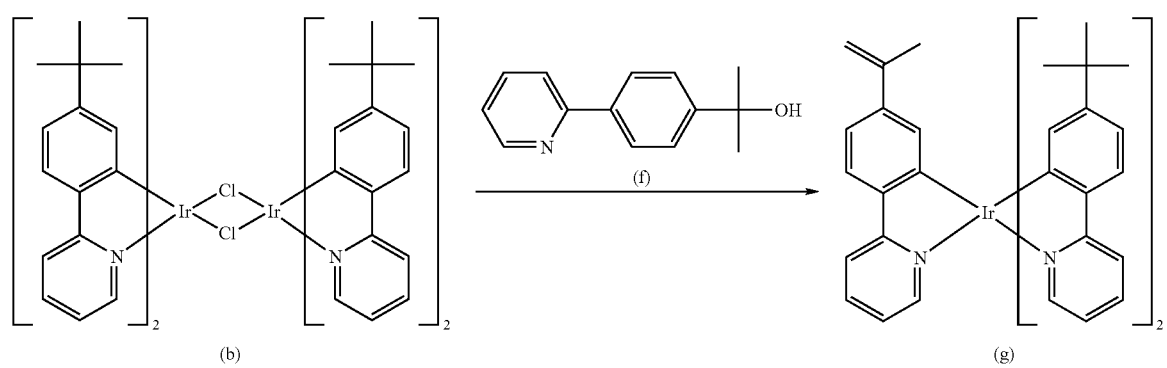

by the method described in Patent document 1) and the compound represented by the formula (C2) were used instead of the compound represented by the formula (B2) and the compound represented by the formula (C1).

The weight-average molecular weight (Mw) of polymer (VI) was 81500 and its molecular weight distribution index (Mw/Mn) was 2.31. In polymer (VI), the ratio of the number of a structural unit derived from 9-ethyl-3-vinylcarbazole (x) and the number of a structural unit derived from the compound represented by the formula (C2) (y) (X:Y), as estimated from the results determined by $^{13}$C-NMR spectra, is 70:30.

Synthetic Example 9

Synthesis of Polymer (VII)

Polymer (VII) was obtained in the same way as Synthetic example 7 (7-3) except that iridium complex (h) represented by the following formula (synthesized by the method described in JP-A-2003-206320), the compound represented by the formula (B5) and the compound represented by the formula (C2) were used instead of iridium complex (g), the compound represented by the formula (B2) and the compound represented by the formula (C1). The weight-average molecular weight (Mw) of polymer (VII) was 94500 and its molecular weight distribution index (Mw/Mn) was 2.55. In polymer (VII), the ratio of the number of a structural unit derived from iridium complex (h) (z), the number of a structural unit derived from the compound represented by the formula (B5) (x) and the number of a structural unit derived from the compound represented by the formula (C2) (y) (Z:X:Y), as estimated from the results determined by elemental analysis using ICP-MS and $^{13}$C-NMR spectra, is 6:47:47.

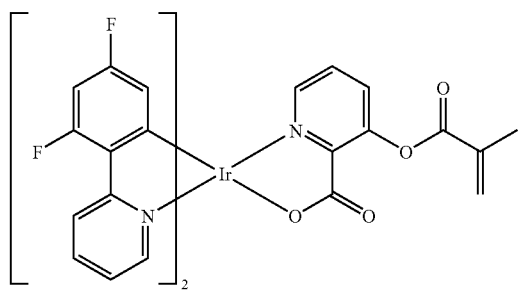

Synthetic Example 10

Synthesis of Polymer (VIII)

Polymer (VIII) was obtained in the same way as Synthetic example 1 except that N-vinylcarbazole and the compound represented by the formula (C3) were used instead of the compound represented by the formula (B2) and the compound represented by the formula (C1).

The weight-average molecular weight (Mw) of polymer (VIII) was 51000 and its molecular weight distribution index (Mw/Mn) was 2.25. In polymer (VIII), the ratio of the number of a structural unit derived from N-vinylcarbazole (x) and the number of a structural unit derived from the compound represented by the formula (C3) (y) (X:Y), as estimated from the results determined by $^{13}$C-NMR spectra, is 68:32.

Synthetic Example 11

Synthesis of Polymer (IX)

(11-1) Synthesis of Compound (i)

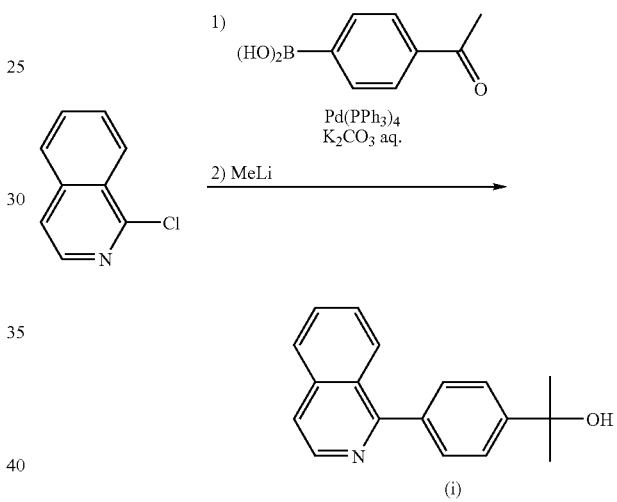

Compound (i) was synthesized as shown in Scheme (7). 1-Chloroisoquinoline (5.0 g, 33 mmol), 4-acetylphenylboronic acid (5.5 g, 34 mmol) and tetrakis(triphenylphosphine) palladium (0.35 g, 0.30 mmol) were dissolved to 1,2-dimethoxyethane (50 mL). An aqueous solution (50 mL) of potassium carbonate (12.3 g, 89 mmol) was added here and the mixture was heated under reflux for 3 hr. After the resultant reaction solution was allowed to cool to room temperature, water (100 mL) and ethyl acetate (100 mL) were added and the organic layer was dried by adding magnesium sulfate. The solvent was distilled off under reduced pressure and to the residue diethyl ether (50 mL) and a diethyl ether solution (1.0 mol/L, 35 mmol) (35 mL) containing methyllithium were added and the mixture was stirred at room temperature for 2 hr. The solvent was distilled off from the reaction solution and the obtained crude product was purified with silica-gel column chromatography to obtain compound (i) (4.8 g, 19 mmol).

(11-2) Synthesis of Iridium Complex (j)

Scheme (8)

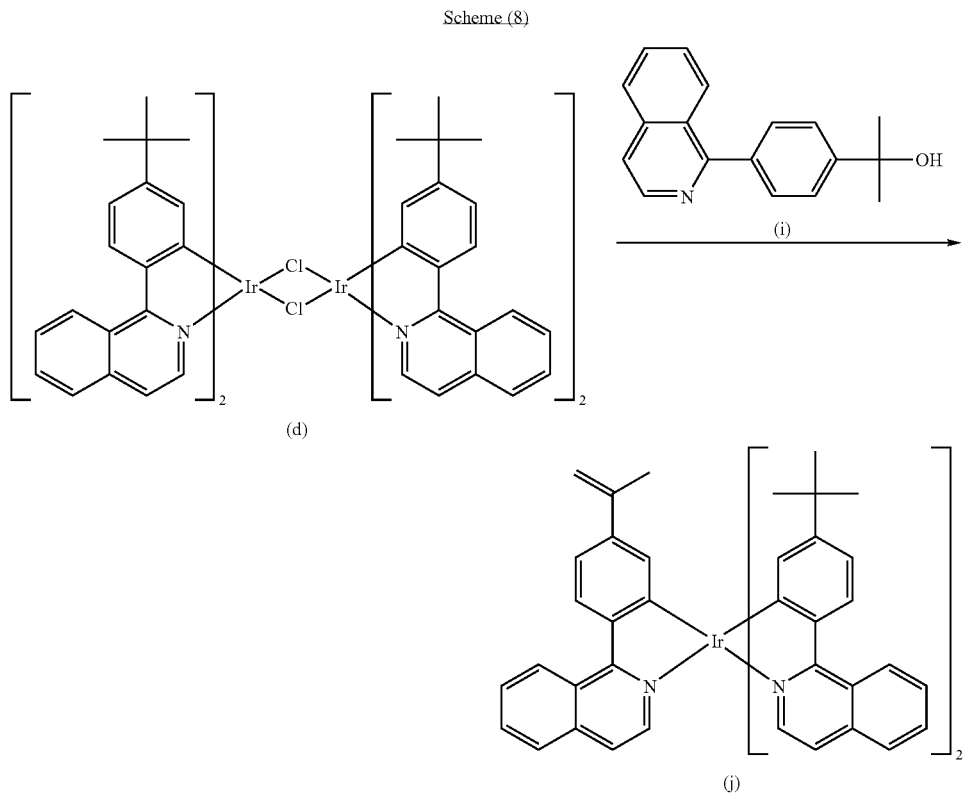

Complex (j) was synthesized as shown in Scheme (8). To a mixture of iridium complex (d) (0.61 g, 0.41 mmol) and compound (i) (0.22 g, 0.88 mmol) glycerol (10 mL) was added and the mixture was heated with stirring at 200° C. for 12 hr. After the reaction solution was cooled down to room temperature, water (100 mL) was added here and the resultant precipitate was collected by filtration and dried. The obtained crude product was purified with silica-gel column chromatography to obtain iridium complex (j) (0.16 g, 0.17 mmol).

Iridium complex (j) was characterized by elemental analysis and mass spectrometric analysis. The results are shown below.

Elemental analysis: Calculated for $C_{56}H_{50}IrN_3$: C, 70.26; H, 5.26; N, 4.39. Found: C, 69.90; H, 5.38; N, 4.61.

Mass spectrometric analysis (FAB): 957 (M$^+$).

(11-3) Synthesis of Polymer (IX)

Polymer (IX) was obtained in the same way as Synthetic example 7 (7-3) except that iridium complex (j), the compound represented by the formula (B1) and the compound represented by the formula (C3) were used instead of iridium complex (g), the compound represented by the formula (B2) and the compound represented by the formula (C1).

The weight-average molecular weight (Mw) of polymer (IX) was 61900 and its molecular weight distribution index (Mw/Mn) was 2.18. In polymer (IX), the ratio of the number of a structural unit derived from iridium complex (j) (z), the number of a structural unit derived from the compound represented by the formula (B1) (x) and the number of a structural unit derived from the compound represented by the formula (C3) (y) (Z:X:Y), as estimated from the results determined by elemental analysis using ICP-MS and $^{13}$C-NMR spectra, is 5:43:52.

Synthetic Example 12

Synthesis of Iridium Complex (E-34)

Scheme (9)

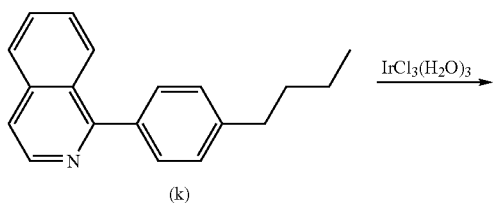

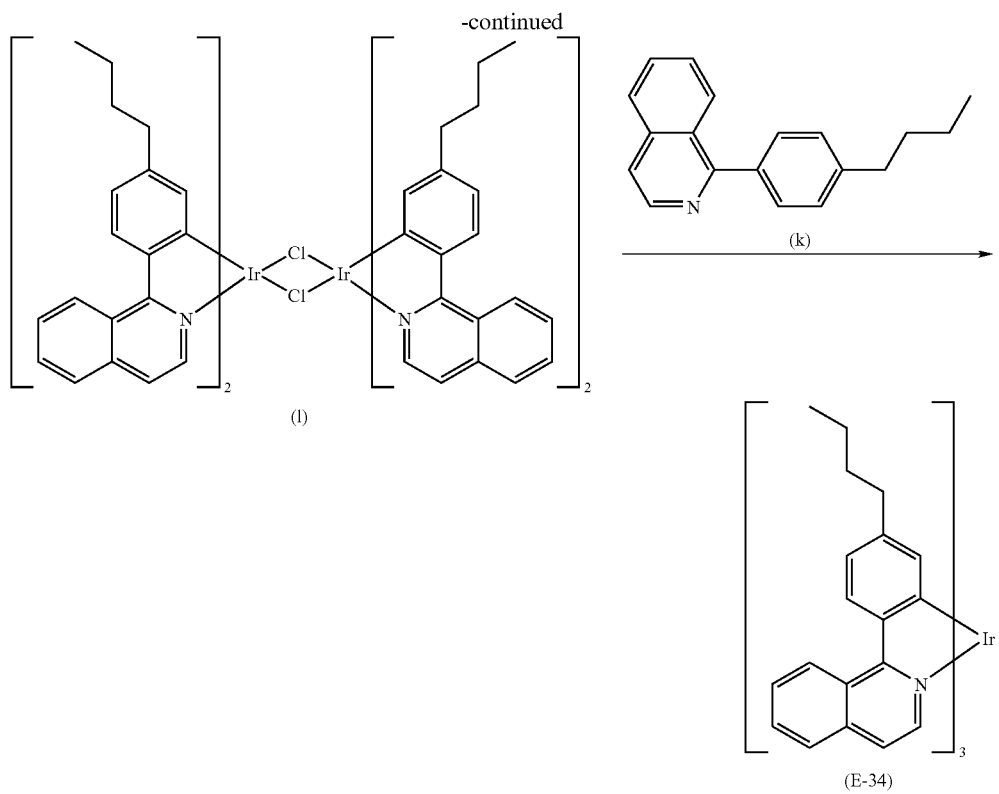

Complex (E-34) was synthesized as shown in Scheme (9). Compound (k) was synthesized by the same method as synthesis of compound (c) except that 4-n-butylphenylboronic acid was used instead of 4-tert-butylphenylboronic acid. Then iridium complex (l) was synthesized by the same method as synthesis of iridium complex (b) except that compound (k) was used instead of compound (a). To a mixture of iridium complex (l) (2.4 g, 1.6 mmol) and compound (k) (2.0 g, 7.6 mmol) glycerol (20 mL) was added and the mixture was heated with stirring at 200° C. for 24 hr. After the reaction solution was cooled down to room temperature, water (200 mL) was added here and the resultant precipitate was collected by filtration and dried. The obtained crude product was purified with silica-gel column chromatography to obtain iridium complex (E-34) (0.60 g, 0.62 mmol).

Iridium complex (E-34) was characterized by elemental analysis and mass spectrometric analysis. The results are shown below.

Elemental analysis: Calculated for $C_{57}H_{54}IrN_3$: C, 70.34; H, 5.59; N, 4.32. Found: C, 70.38; H, 5.61; N, 4.19.

Mass spectrometric analysis (FAB): 973 ($M^+$).

Synthetic Example 13

Synthesis of Polymer (X)

(13-1) Synthesis of Compound (n)

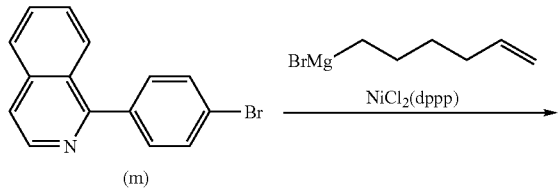

Compound (n) was synthesized as shown in Scheme (10). Compound (m) was synthesized by the same method as synthesis of compound (e) except that 1-chloroisoquinoline was used instead of 2-bromopyridine. Compound (m) (1.5 g, 5.3 mmol) and dichloro(bis(diphenylphosphino)propane)nickel (0.10 g, 0.18 mmol) were dissolved to THF (20 mL). To this solution, a THF solution (0.50 M, 15 mL, 7.5 mmol) containing 5-hexenylmagnesium bromide was added dropwise with ice-cooling and the mixture was stirred at room temperature for 5 hr. After methanol (5 mL) was added to the reaction solution, the solvent was distilled off under reduced pressure and the residue was purified with silica-gel column chromatography to obtain compound (n) (0.90 g, 3.1 mmol).

(13-2) Synthesis of Iridium Complex (o)

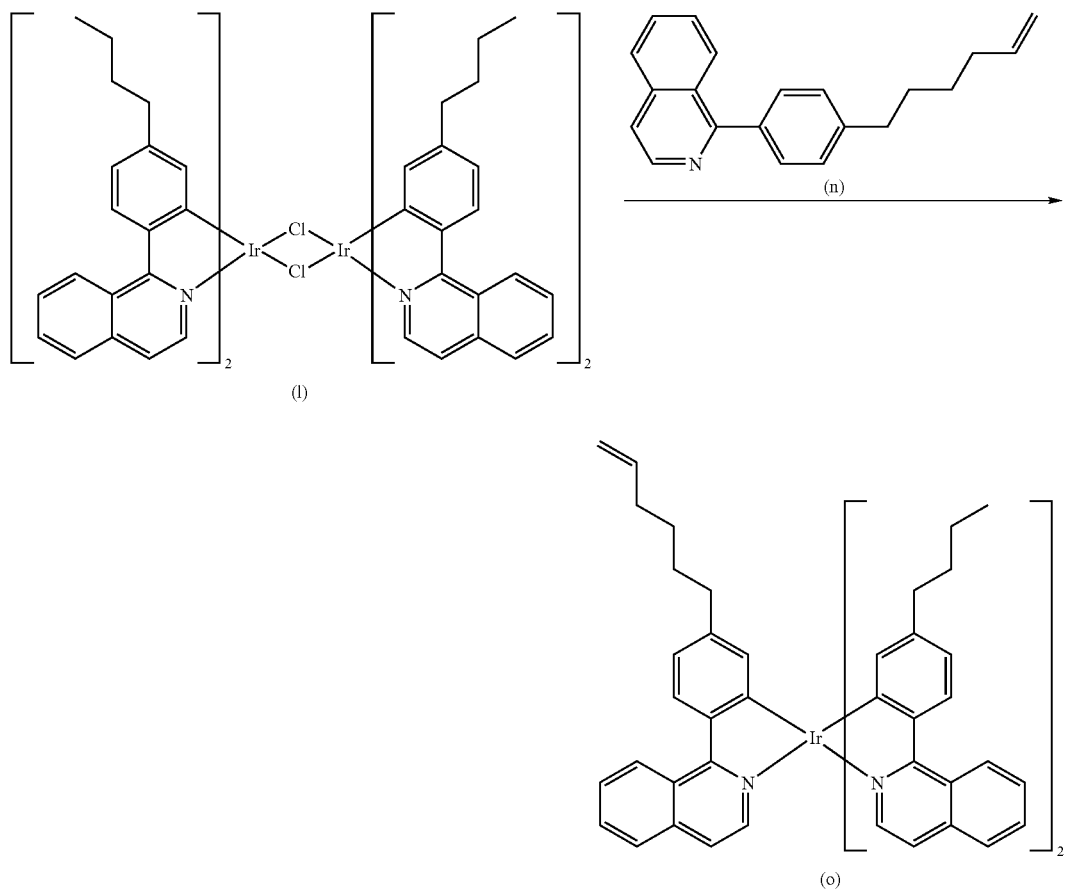

Complex (o) was synthesized as shown in Scheme (11). To a mixture of iridium complex (l) (0.50 g, 0.33 mmol) and compound (n) (0.20 g, 0.70 mmol) glycerol (10 mL) was added and the mixture was heated with stirring at 180° C. for 48 hr. After the reaction solution was cooled down to room temperature, water (100 mL) was added here and the resultant precipitate was collected by filtration and dried. The obtained crude product was purified with silica-gel column chromatography to obtain iridium complex (o) (0.10 g, 0.10 mmol).

Iridium complex (o) was characterized by elemental analysis and mass spectrometric analysis. The results are shown below.

Elemental analysis: Calculated for $C_{59}C_{56}IrN_3$: C, 70.91; H, 5.65; N, 4.20. Found: C, 70.65; H, 5.82; N, 4.44.

Mass spectrometric analysis (FAB): 999 ($M^+$).

(13-3) Synthesis of Polymer (X)

Polymer (X) was obtained in the same way as Synthetic example 7 (7-3) except that iridium complex (o), the compound represented by the formula (B1) and the compound represented by the formula (C3) were used instead of iridium complex (g), the compound represented by the formula (B2) and the compound represented by the formula (C1).

The weight-average molecular weight (Mw) of polymer (X) was 61900 and its molecular weight distribution index (Mw/Mn) was 2.50. In polymer (X), the ratio of the number of a structural unit derived from the iridium complex (o) (z), the number of a structural unit derived from the compound represented by the formula (B1) (x) and the number of a structural unit derived from the compound represented by the formula (C3) (y) (Z:X:Y), as estimated from the results determined by elemental analysis using ICP-MS and $^{13}$C-NMR spectra, is 4:45:51.

Synthetic Example 14

Coating Solution (I)

Polymer (I) (92 mg) and iridium complex (E-2) (8 mg) were dissolved in toluene (2900 mg) and this solution was filtered through a filter with a pore diameter of 0.2 μm to prepare coating solution (I).

Synthetic Example 15

Coating Solution (II)

Coating solution (II) was prepared in the same way as Synthetic example 14 except that polymer (II) and iridium complex (E-33) (synthesized by the method described in Published Japanese translation of a PCT application 2004-506305) instead of polymer (I) and iridium complex (E-2).

Synthetic Example 16

Coating solution (III)

Coating solution (III) was prepared in the same way as Synthetic example 14 except that polymer (III) and iridium complex (E-17) were used instead of polymer (I) and iridium complex (E-2)

Synthetic Example 17

Coating Solution (IV)

Coating solution (IV) was prepared in the same way as Synthetic example 14 except that polymer (IV) and iridium complex (E-2) were used instead of polymer (I) and iridium complex (E-2).

Synthetic Example 18

Coating Solution (V)

Polymer (V) (100 mg) was dissolved in toluene (2900 mg) and this solution was filtered through a filter with a pore diameter of 0.2 μm to prepare coating solution (V).

Synthetic Example 19

Coating Solution (VI)

Coating solution (VI) was prepared in the same way as Synthetic example 14 except that polymer (VI) and iridium complex (E-33) were used instead of polymer (I) and iridium complex (E-2).

Synthetic Example 20

Coating Solution (VII)

Coating solution (VII) was prepared in the same way as Synthetic example 18 except that polymer (VII) was used instead of polymer (V).

Synthetic Example 21

Coating Solution (VIII)

Coating solution (VIII) was prepared in the same way as Synthetic example 14 except that polymer (VIII) and iridium complex (E-17) were used instead of polymer (I) and iridium complex (E-2).

Synthetic Example 22

Coating Solution (IX)

Coating solution (IX) was prepared in the same way as Synthetic example 18 except that polymer (IX) was used instead of polymer (V).

Synthetic Example 23

Coating Solution (X)

Coating solution (X) was prepared in the same way as Synthetic example 14 except that polymer (III) and iridium complex (E-34) were used instead of polymer (I) and iridium complex (E-2).

Synthetic Example 24

Coating Solution (XI)

Coating solution (XI) was prepared in the same way as Synthetic example 14 except that Polymer (VIII) and iridium complex (E-34) were used instead of polymer (I) and iridium complex (E-2).

Synthetic Example 25

Coating Solution (XII)

Coating solution (XII) was prepared in the same way as Synthetic example 18 except that polymer (X) was used instead of polymer (V).

Example 1

Production of Organic EL Devices and Evaluation of Light Emitting Characteristics Thereof An ITO-attached substrate (Nippo Electric Co., Ltd.) was used. This was a substrate wherein two lines of ITO (indium tin oxide) electrode (anode) of a width of 4 mm were fabricated in a stripe pattern on one surface of a 25 mm-square glass substrate.

First, on the above-mentioned ITO-attached substrate, poly(3,4-ethylenedioxythiophene)-poly(styrenesulfonic acid) (Bayer Co., Ltd., a trade name BaytronP) was coated by spin-coating method with a rotation rate of 3500 rpm and a coating time of 40 sec. Then the coated substrate was dried in a vacuum dryer under reduced pressure at 60° C. for 2 hr to form an anode buffer layer. The film thickness of obtained anode buffer layer was about 50 nm.

Next, on the above-mentioned anode buffer layer, coating solution (I) was coated by spin coating with a rotation rate of 3000 rpm and a coating time of 30 sec. After coating the substrate was dried at room temperature (25° C.) for 30 min to form a light emitting layer. The film thickness of the obtained light emitting layer was about 100 nm.

Then, the substrate whereon the light emitting layer was formed was loaded into a deposition apparatus. Calcium and aluminum were co-deposited with a weight ratio of 1:10 so as to form two lines of cathode with a width of 3 mm in a stripe pattern perpendicular to the running direction of the anode. The film thickness of the obtained cathode was about 50 μm.

As the last step, lead wires were attached to the anode and cathode (hard-wiring) in an argon atmosphere to produce four organic EL devices having a length of 4 mm and a width of 3 mm. To the above-mentioned organic EL devices, a voltage was applied using a programmable DC voltage/current generator (Advantest Corp., TR6143) to bring about emission. The luminance brightness was measured using a luminance meter (Topcon Corp., BM-8). The luminescent color, maximum luminous external quantum efficiency and half life time of initial brightness of 100 cd/m$^2$ of the produced organic EL devices are shown in Table 1.

Examples 2 to 4 and Comparative Examples 1 to 8

Production of Organic EL Devices and Evaluation of Light Emitting Characteristics Thereof Except that the coating solution was changed to each solution shown in Table 1, the organic EL devices were produced and measurements were carried out in the same way as Example 1. The luminescent color, maximum luminous external quantum efficiency and half life time of initial brightness of 100 cd/m² of the produced organic EL devices are shown in Table 1.

TABLE 1

| | Coating solution | Luminescent color | Maximum luminous external quantum efficiency (%) | half life time of initial brightness of 100 cd/m² (h) |
|---|---|---|---|---|
| Ex. 1 | (I) | Green | 7.5 | 5900 |
| Comp. Ex. 1 | (IV) | Green | 4.6 | 1200 |
| Comp. Ex. 2 | (V) | Green | 6.0 | 3100 |
| Ex. 2 | (II) | Sky blue | 6.1 | 2000 |
| Comp. Ex. 3 | (VI) | Sky blue | 3.8 | 300 |
| Comp. Ex. 4 | (VII) | Sky blue | 4.9 | 1100 |
| Ex. 3 | (III) | Red | 7.1 | 4700 |
| Comp. Ex. 5 | (VIII) | Red | 3.0 | 1900 |
| Comp. Ex. 6 | (IX) | Red | 5.9 | 3500 |
| Ex. 4 | (X) | Red | 7.0 | 4900 |
| Comp. Ex. 7 | (XI) | Red | 2.9 | 1600 |
| Comp. Ex. 8 | (XII) | Red | 4.0 | 2000 |

The invention claimed is:

1. An organic electroluminescence device comprising one layer or two or more layers of organic layer sandwiched between an anode and a cathode wherein:
   at least one of the organic layers comprises a phosphorescent compound and a polymer;
   wherein the phosphorescent compound is an iridium complex, and
   the polymer consists essentially of a structural unit derived from a monomer represented by the following formula (1) and a structural unit derived from a monomer having heterocycle(s) containing two or more heteroatoms:

(1)

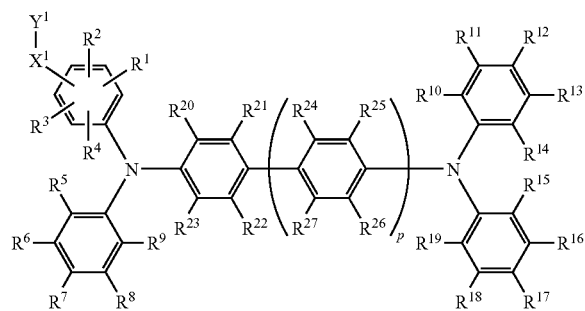

wherein in formula (1), $R^1$-$R^{27}$ each represents independently a hydrogen atom, a halogen atom, a cyano group, an amino group, an alkyl group having 1 to 10 carbon atoms or an alkoxy group having 1 to 10 carbon atoms; within each of the groups $R^1$-$R^4$, $R^5$-$R^9$, $R^{10}$-$R^{14}$ and $R^{15}$-$R^{19}$, two groups bonding to adjacent carbon atoms in a benzene ring may bond to each other forming a fused ring; $X^1$ represents a single bond, an oxygen atom (—O—), a sulfur atom (—S—), —SO—, —SO$_2$—, —NR— (R represents a hydrogen atom, an alkyl group having 1 to 4 carbon atoms or a phenyl group), —CO— or a divalent organic group having 1 to 20 carbon atoms (the organic group may be substituted with an atom or a group selected from the group consisting of an oxygen atom (—O—), a sulfur atom (—S—), —SO—, —SO$_2$—, —NR— (R represents a hydrogen atom, an alkyl group having 1 to 4 carbon atoms or a phenyl group) and —CO—); $Y^1$ represents a polymerizable functional group; and p represents 0 or 1; and wherein the monomer having heterocycle(s) is selected from the group consisting of monomers represented by the following formulae (2) to (5):

(2)

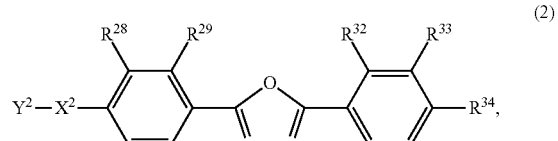

(3)

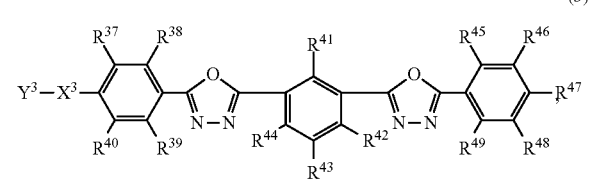

(4)

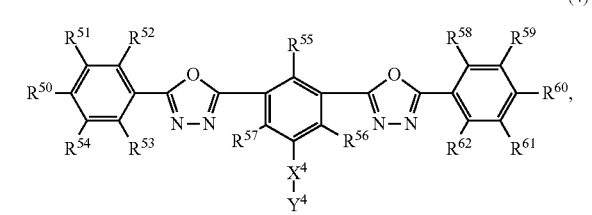

(5)

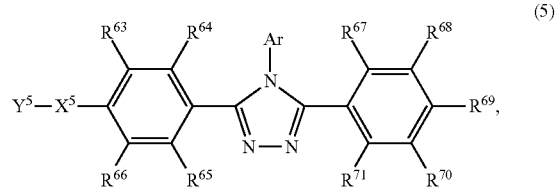

wherein in formulae (2) to (5), each of $R^{28}$-$R^{71}$ has the same definition as $R^1$ in the formula (1); within each of the groups $R^{28}$-$R^{31}$, $R^{32}$-$R^{36}$, $R^{37}$-$R^{40}$, $R^{42}$-$R^{44}$, $R^{45}$-$R^{49}$, $R^{50}$-$R^{54}$, $R^{58}$-$R^{62}$, $R^{63}$-$R^{66}$ and $R^{67}$-$R^{71}$, two groups bonding to adjacent carbon atoms in a benzene ring may bond to each other forming a fused ring; $X^2$-$X^5$ each has the same definition as $X^1$ in the formula (1); and $Y^2$-$Y^5$ each has the same definition as $Y^1$ in the formula (1), and in the formula (5), Ar represents a phenyl group or a naphthyl group.

2. An image display device comprising the organic EL device of claim 1.

3. An area light source comprising the organic EL device of claim 1.

* * * * *